United States Patent
Watabe

(10) Patent No.: US 6,531,894 B2
(45) Date of Patent: Mar. 11, 2003

(54) PULSE GENERATION CIRCUIT AND A DRIVE CIRCUIT

(75) Inventor: Kiyoto Watabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/754,062

(22) Filed: Jan. 5, 2001

(65) Prior Publication Data

US 2002/0017918 A1 Feb. 14, 2002

(30) Foreign Application Priority Data

Jan. 14, 2000 (JP) ........................................ 2000-005566

(51) Int. Cl.[7] .......................................... H03K 19/0175
(52) U.S. Cl. ............................ 326/82; 326/29; 326/93; 327/229
(58) Field of Search ............................. 326/28, 29, 57, 326/58, 82, 83, 93, 104; 327/227, 229

(56) References Cited

U.S. PATENT DOCUMENTS 5,389,834 A  * 2/1995 Kinugasa et al. ............. 326/21
5,514,981 A    5/1996 Tam et al.
5,877,647 A  * 3/1999 Vajapey et al. .............. 327/391
5,917,359 A    6/1999 Fukunaga et al.

FOREIGN PATENT DOCUMENTS

| JP | 4-230117 | 8/1992 |
|---|---|---|
| JP | 8-65143 | 3/1996 |
| JP | 9-200017 | 7/1997 |

OTHER PUBLICATIONS

Taub et al. "Digital Integrated Electronics", 1977, McGraw–Hill, Inc, pp. 326–327.*

* cited by examiner

Primary Examiner—Daniel Chang
(74) Attorney, Agent, or Firm—Oblon, Spivak, McClelland, Maier & Neustadt, P.C.

(57) ABSTRACT

A pulse generation circuit which can be controlled to generate on-signals and off-signals simultaneously for use in testing the protection circuit of a power device's drive circuitry. The protection circuit prevents faulty operation due to dv/dt transient signals which can cause the S and R input signals to a set-reset flip-flop circuit to simultaneously be HI, resulting in an error condition. Protection circuit 26a has the structure as shown in FIG. 1. A pulse generation circuit, as shown in FIG. 3, can be used to provide simultaneous changes of logic value at B and C to test the protection circuit.

16 Claims, 9 Drawing Sheets

PULSE GENERATION CIRCUIT AND A DRIVE CIRCUIT

BACK GROUND OF THE INVENTION

1. Field of the Invention

The present invention relates to a drive circuit of the power device, which prevents faulty operations by dv/dt transient signals.

2. Description of the Background Art

FIG. 7 shows a circuit of a semiconductor device 100, having a conventional drive circuit of the power device. In FIG. 7, the circuit has the power source 20 to supply the power source electric potential Vdd against the ground electric potential COM and the half-bridge type power device 19 which includes totem pole-connected power device 17, 18, e.g.IGBT (insulating gate bipolar transistor) installed between the power source electric potential Vdd and the ground electric potential COM. Power devices 17, 18 are reverse and parallel connected to the free-wheel-diode D1 and D2. Moreover, the load (the inductive load, e.g. motors) is connected between a connecting node N1 of power devices 17 and 18, and the ground electric potential COM.

The power device 17 is a device switching between the potential at the connecting node N1 as a standard electric potential and the power source electric potential Vdd supplied by the power source20. The power device 17 is called high electric potential side power device. Contrary, the power device 18 is called low electric potential side power device.

Also, the semiconductor device 100 shown in FIG. 7, comprises a drive circuit HD of high electric potential side power device and a drive circuit LD of low electric potential side power device, but an explanation about the drive circuit LD of low electric potential side power device is omitted, because the drive circuit LD relates less to the present invention.

Following description explains about a structure of the high electric potential side power device. Two outputs of a pulse generation circuit 1 generating pulsed on-signals and off-signals corresponding to input signals given from a microcomputer provided outside, are connected to gate electrodes of high-voltage N-channel MOS (HNMOS) transistors 2 and 3 which functions as a level shift transistor. Each of drain electrodes of HNMOS transistors 2 and 3, is connected to one ends of resistances 4 and 5, moreover these electrodes are connected to inputs of inverter circuits 6 and 7, too. Also, the ground electric potential COM is given to both of source electrodes of HNMOS transistors 2 and 3.

Moreover, outputs of inverter circuits 6 and 7, are connected to set input and reset input of not-inversed-input-typed set-reset-flip-flop circuit 10. The output Q of said set-reset-flip-flop circuit 10 is connected to a gate electrode of NMOS transistor 12, and the output Q is connected to an input of the inverter circuit 11, too. Also, the output of the inverter circuit 11 is connected to the gate electrode of NMOS transistor 13. The source electrode of NMOS transistor 12 is connected to the drain electrode of NMOS transistor 13, and that source electrode is connected to the gate electrode of power device 17, too. High electric potential side power source 16 is provided between the drain electrode of NMOS transistor 12 and the connecting node N1.

Other ends of resistances 4 and 5 are connected to the drain electrode of NMOS transister12, or, positive potential output of high electric potential side power source 16. Also, the source electrode of NMOS transistor 13, or, negative potential output of high electric potential side power source 16, is connected to anode of diode 8 and that source electrode is connected to anode of diode of a diode 9, too. The cathode of diode 8, 9 are connected to the drain electrodes of HNMOS transistor 2 and 3, respectively.

In said drive circuit HD of high electric potential side power device, dv/dt transient signal which is spread signal of quick transition of voltage, occurs in the line (the line is called line L1 hereinafter) between the connecting node N1 and anodes of diode 8, 9 depending on the switching condition of the half-bridge type power device 19. Then electric current (the electric current is called dv/dt electric current hereinafter) which is given by the product of the parasitic capacity C and dv/dt transient signal, flows to HNMOS transistors 2 and 3 simultaneously.

Moreover, dv/dt electric current flowing to HNMOS transistors 2 and 3, has same level of the electric current flowing in ordinary switching, so voltage drops occur at resistance 4 and 5 at the same time. As a result, "H" (positive value in active high) as set input and reset input of set-reset-flip-flop circuit 10, is simultaneously given to the set-reset-flip-flop circuit 10. In general, it is impermissible that "H" is simultaneously given to the set input and the reset input of non-inversed-input-type set-reset-flip-flop circuit, and the operation which can't be forecasted, in short, mis-operation is caused.

A protection circuit 26b using the logic circuit showing in FIG. 8 is provided between a level-shift circuit 25 level-shifting on-signals and off-signals of the pulse generation circuit1 and the set-reset-flip-flop circuit 10 to prevent such mis-operations. A following description explains about the structure of the protection circuit 26b. The protection circuit 26b has the NAND circuit G101 which is inputted level-shifted on-signals namely output of the inverter circuit 7 as the first level-shifted signal, and the NAND circuit G121 which is inputted level-shifted off-signals namely output of the inverter circuit 6 as the second level-shifted signal, and the NAND circuit G111 which is inputted the first and second level-shifted signals, in the first stage. Series connected inverter circuits G102, G104 are connected to the NAND circuit G101, and series connected inverter circuits G122, G124 are connected to the NAND circuit G121, and the inverter circuit G112 is connected to the NAND circuit G111. Moreover, outputs of the inverter circuits G104, G112 are inputted to the NOR circuit G13, and outputs of the inverter circuits G124, G112 are inputted to the NOR circuit G14. These outputs of NOR circuit G13, G14 are set-signals and reset-signals to the set-reset flip-flop circuit 10.

When dv/dt transient signal flows to the line L1, the first and second level-shifted signals are simultaneously inputted to the protection circuit 26b. At the time, logic value of signal passing through the NAND circuit G101, the inverter circuits G102, G104 and signal passing through the NAND circuit G121, the inverter circuits G122, G124 are opposite to the logic value of signal passing through the NAND circuit G111 and the inverter circuit G112, so the NOR circuit G13 prevents outputting the set signal to the set-reset-flip-flop circuit 10. The NOR circuit G14 prevents outputting the reset signal to the set-reset-flip-flop circuit 10 as well as the NOR circuit G13. As the result, the structure according to above prevents mis-operations of set-reset-flip-flop circuit 10.

However there is a gate delay at each logic circuits composing the protection circuit 26b. In the case of thinking strictly about the gate delay, the protection circuit 26b can not prevent always mis-operations of the set-reset-flip-flop circuit 10. In other words, the number of logic circuits which signal passing through the NAND circuit G101, the inverter circuits G102, G104 and signal passing through the NAND circuit G121, the inverter circuits G122, G124 go through, is different from the number of logic circuits which signal passing through the NAND circuit G111 and the inverter circuit G112 goes through, so the transient hazard happened.

Following description explains about said phenomenon using the timing chart showing in FIG. 9. When the transient dv/dt signal flows to the line L1, at first the displacement currents flow through the parasitic capacity of the HNMOS transistor 2, 3 and electric potentials at VR1, VR2 which are input terminals of the inverter circuits 6, 7, fall down by voltage drop by the displacement currents and resistances 4, 5. When electric potentials at VR1, VR2 are lower than logic threshold of "L" (negative value in active High) of the inverter circuits 6, 7, the logic values at B,C which are output terminals of the inverter circuits 6, 7 turn over. In FIG. 9, the period is indicated by Tv.

If the logic values at B and C change "L" to "H", the logic values at D, E which are output terminals of the inverter circuits G104, G124, and at F which is output terminal of the inverter circuit G112, and at G, H which are output terminals of the NOR circuits G13, G14, are changed respectively. Hereinbelow, there are 3 gates between B and D, C and E, and there are 2 gates between B, C and F. Therefore, logic value at F changes "L" to "H" at first, then logics value at D, E is delayed for one gate, and changes "H" to "L". There is no problem in this case, because inputs to the NOR circuit G13, G14 do not become "L" simultaneously.

On the other hand, logic values at B, C change "H" to "L", logic value at F changes "H" to "L" at first, logic values at D,E are delayed for one gate, and change "L" to "H". In this case, the period Td that "L" is inputted simultaneously to the NOR circuit G13, G14, happens. "L" at D, E, F in the period Td is sent to G and H through the NOR circuits G13, G14 (for one gate), so the set signal and the reset signal are simultaneously inputted to the set-reset-flip-flop circuit 10.

These transient hazard may be dissolved along with the improvement of devices comprising logic circuits, e.g. transistors, by decreasing delay of gate, however this problem can not be solved fundamentally by only the improvement of devices, because the change speed of set signals and reset signals of the set-reset-flip-flop circuit 10 becomes simultaneously fast. Therefore, conventional protection circuits can not prevent perfectly mis-operations of the set-reset-flip-flop circuit 10.

Apart from the protection circuit 26b, there is a problem in the pulse generation circuit 1, too. FIG. 10 shows the structure of conventional pulse generation circuit 1d. In other words, input-signal is inputted to the inverter circuits G200, G201, and the inverter circuit G202 is series-connected to the inverter circuit G201. Moreover, output signals of the inverter circuits G200, G202 are inputted to the NAND circuit G203, and the output signal of the NAND circuit G203 is outputted as off-signal through the inverter circuit G204. Also, the output signal of the inverter circuit G200 is inputted to the inverter circuits G210, G211, and the inverter circuit G212 is series-connected to the inverter circuit G212. Output signals of the inverter circuits G210, G212 are inputted to the NAND circuit G213, the output signal of the NAND circuit G213 is outputted as on-signal through the inverter circuit G214.

In the pulse generation circuit 1d, the difference of delay time of inverter and the number of inverters which signals pass through is used. In other words, the NAND circuit G203 generates the pulsed "L" corresponding to the difference of the spread time of change of input signal "H" to "L", passing through the inverter circuit G200, the inverter circuits G201 and G202, and after that, the pulsed "L" is reversed to the pulsed "H" by the inverter circuit G204, so the off-signal generates. Also, the NAND circuit G213 generates the pulsed "L" corresponding to the difference of the spread time of change of input signal "L" to "H", passing through the inverter circuit G210, the inverter circuits G211 and G212, and after that the pulsed "L" is reversed to the pulsed "H" by the inverter circuit G214, so the on-signal generates. FIG. 11 shows the timing chart showing said condition. The power device 17 is operated by edge-trigger of the pulsed on-signal and off-signal to restrain the consumption of the power to a minimum.

The pulse generation circuit 1d can not simultaneously generate on-signal and off-signal because this circuit has said structure. Therefore, it takes time to test the protection circuit 26b, because it must apply dv/dt transient signal from outside to check the operation of the protection circuit 26b.

The object of the present invention is providing the protection circuit, which never inputs simultaneously set-signal and reset-signal to the set-reset-flip-flop circuit, and the pulse generation circuit, which can generate on-signal and off-signal simultaneously for the test.

SUMMARY OF THE INVENTION

According to a first aspect of the present invention, a protection circuit comprises a plurality of logic elements and delay elements, each having a predetermined amount of delay respectively, first and second input signal signals as pulse signals are inputted to the protection circuit and the protection circuit generates a plurality of inside signals by the first and second input signals passing respectively through a part of the plurality of logic elements and delay elements, the plurality of inside signals pass through a part of the plurality of logic elements and delay elements, and each of the plurality of inside signals receives different amount of delay depending on the number and/or sorts of logic elements and delay elements passed through, the protection circuit outputs first and/or second output signals transiting corresponding to the first and/or second signals respectively by logic-operating the each of the plurality of inside signals in a part of the plurality of the logic elements, when the first and second input signals transit at different time, and the protection circuit prevents transition of the first and second output signals by negating each of the plurality of the inside signals in a part of the plurality of logic elements by difference of the amount of delay received by each of the plurality of inside signals, when the first and second input signals transit simultaneously.

According to a second aspect of the present invention, a protection circuit according to claim 1, comprises a first delay element which the first input signal is inputted to, and outputs the first input signal with delaying for the amount of first delay, a second delay elements which said second input signal is inputted to, and outputs said second input signal with delaying for the amount of said first delay, a logical AND element which the first and second input signals are inputted to, and outputs an AND of the first and second input signals with delaying for the amount of the first delay, a third delay element which the output of said first delay element is inputted to, and outputs the output of the first delay element with delaying for the amount of second delay, a fourth delay element which the output of the logical AND element is inputted to, and outputs the output of the logical AND element with delaying for the amount of the second delay, a fifth delay element which the output of said second delay element is inputted to, and outputs the output of said second delay element with delaying for the amount of said second delay, a logical OR element which outputs of the logical AND element and the fourth delay element are inputted to, and outputs an OR of outputs of the logical AND element and the fourth delay element with delaying for the amount of the second delay, a first inverter element which the output of the third delay element is inputted to, and logic-reverses the output of the third delay element and outputs the output of the third delay element with delaying for the amount of third delay, a second inverter element which the output of fifth delay element is inputted to, and logic-reverses the output of the fifth delay element and outputs the output of the fifth delay element with delaying for the amount of the third delay, a first logical NOR element which outputs of the logical OR element and the first inverter element are inputted to, and logic-reverses an OR of outputs of the OR element and the first inverter element and outputs the OR as the first output signal, and a second logical NOR element which outputs of the logical OR element and the second inverter element are inputted to, and logic-reverses an OR of outputs of the logical OR element and the second inverter element and outputs the OR as the second output signal, and wherein the amount of said second delay being greater than the amount of said third delay.

According to a third aspect of the present invention, a protection circuit according to claim 2, wherein the first delay element comprises a first NAND circuit having input terminals both of which the first input signal is inputted to, and a first inverter circuit which the output of the first NAND circuit is inputted to, the second delay element comprising a second NAND circuit having input terminals both of which the second input signal is inputted to, and a second inverter circuit which the output of said second NAND circuit is inputted to, the logical AND element comprising a third NAND circuit which the first and second input signals are inputted to, and a third inverter circuit which the output signal of the third NAND circuit is inputted to, the third delay element comprising a first NOR circuit which the output of the first delay element is inputted to both of input terminals, and a fourth inverter circuit which the output of the first NOR circuit is inputted to, the fourth delay element comprising a second NOR circuit which the output of the logical AND element is inputted to both of input terminals, and a fifth inverter circuit which the output of the second NOR circuit is inputted to, the fifth delay element comprising a third NOR circuit which the output of the second delay element is inputted to both of input terminals, and a sixth inverter circuit which the output of the third NOR circuit is inputted to, the logical OR element comprising a fourth NOR circuit which the outputs of the logical AND element and the fourth delay element are inputted to, and a seventh inverter circuit which the output of the fourth NOR circuit is inputted to, the first inverter element comprising an eighth inverter circuit which the output of the third delay element is inputted to, the second inverter element comprising a ninth inverter circuit which the output of the fifth delay element is inputted to, the first logical NOR element comprising a fifth NOR circuit which the outputs of the first inverter element and the OR element are inputted to, and the second logical NOR element comprising a sixth NOR circuit which outputs of the second inverter element and the OR element are inputted to.

According to a fourth aspect of the present invention, a pulse generation circuit, wherein first input signal which level-shifts between first logic value and second logic value having the exclusive relations with the first logic value, is inputted to the pulse generation circuit, and second input signal, or, in addition to the second input signal, third input signal are inputted to the pulse generation circuit, and the pulse generation circuit outputs first pulse on level-transiting of the first input signal from the first logic value to the second logic value, and the pulse generating circuit outputs second pulse on level-transiting of the first input signal from the second logic value to said first logic value, and the pulse generating circuit outputs the first and second pulse when the second or third input signal is inputted.

According to a fifth aspect of the present invention, a pulse generation circuit according to claim 4 comprises a first inverter element which the first input signal is inputted to, and logic-reverses the first input signal and outputs the first input signal, a first delay element which the first input signal is inputted to, and outputs the first input signal with delaying from the output of the first inverter element, a first logical AND element which the outputs of the first inverter element and the first delay element are inputted to, and outputs an AND of the outputs of the first inverter element and the first delay element, a first logical OR element which the output of the first logical AND element and the first logic value are inputted to, and when the second input signal is given instead of the first logic value, the second logic value is inputted to, and outputs an OR of the output of the first logical AND element and the first logic value or the second logic value, as the second pulse, a second inverter element which the output of the first inverter element is inputted to, and logic-reverses the output of the first inverter element and outputs the output of the first inverter element, a second delay element which the output of the first inverter element is inputted to, and outputs the output of the first inverter element with delaying from the output of the second inverter element, a second logical AND element which the outputs of the second inverter element and the second delay element are inputted to, and outputs an AND of outputs of the second inverter element and the second delay element, a second logical OR element which the output of the second logical AND element and the first logic value are inputted to, and when the third input signal is given instead of the first logic value, the second logic value is inputted to, and outputs an OR of the output of the second logical AND element and the first logic value or the second logic value as the first pulse.

According to a sixth aspect of the present invention, a pulse generation circuit according to claim 5, wherein the first inverter element comprises a first inverter circuit which logic-reverses the first input signal and outputs the first input signal, the first delay element comprising a second inverter circuit which logic-reverses the first input signal and outputs the first input signal, and a third inverter circuit which logic-reverses the output of the second inverter circuit and outputs the output of the second inverter circuit, the first logical AND element comprising a first NAND circuit which the outputs of the first inverter element and the first delay element are inputted to, and a fourth inverter circuit which the output of the first NAND circuit is inputted to, the first logical OR element comprising a first NOR circuit which logic-reverses an OR of the output of the first logical AND element and the first or second logic value and outputs the OR, and a fifth inverter circuit which the output of the first NOR circuit is inputted to, the second inverter element comprising a sixth inverter circuit which logic-reverses the output of the first inverter element and outputs the output of the first inverter element, the second delay element comprising a seventh inverter circuit which logic-reverses the output of the first inverter element and outputs the output of the first inverter element, and an eighth inverter circuit which logic-reverses the output of the seventh inverter circuit and outputs the output of the seventh inverter circuit, the second logical AND element comprising a second NAND circuit which the outputs of the second inverter element and the second delay element are inputted to, and a ninth inverter circuit which the output of the second NAND circuit is inputted to, and the second logical OR element comprising a second NOR circuit which logic-reverses an OR of the output of the second logical AND element and the first or second logic value and outputs the OR, and a tenth inverter circuit which the output of the second NOR circuit is inputted to.

According to a seventh aspect of the present invention, a pulse generation circuit according to claim 4 comprises a first inverter element which the first input signal is inputted to, and logic-reverses the first input signal and outputs the first input signal, a first delay element which the first input signal is inputted to, and outputs the first input signal with delaying from the output of the first inverter element, a first logical NAND element which the outputs of the first inverter element and the first delay element are inputted to, and logic-reverses an AND of the outputs of the first inverter element and the first delay element and outputs the AND of the outputs of the first inverter element and the first delay element, a second logical NAND element which the output of the first logical NAND element and the second logic value are inputted to, and when the second input signal is given, instead of the second logic value, the first logic value is inputted to, and logic-reverses an AND of the output of the first logical NAND element and the first or second logic value and outputs the AND as the second pulse, a second inverter element which the output of the first inverter element is inputted to, and logic-reverses the output of the first inverter element and outputs the output of the first inverter element, a second delay element which the output of the first inverter element is inputted to, and outputs the output of the first inverter element with delaying from the output of the second inverter element, a third logical NAND element which the outputs of the second inverter element and the second delay element are inputted to, and logic-reverses an AND of the outputs of the second inverter element and the second delay element and outputs the AND, a fourth logical NAND element which the outputs of the third logical NAND element and the second logic value are inputted to, when the third input signal is given, and instead of the second logic value, the first logic value is inputted to, and logic-reverses an AND of the output of the third logical NAND element and the first or second logic value and outputs the AND as the first pulse.

According to an eighth aspect of the present invention, a pulse generation circuit according to claim 7, wherein the first inverter element comprises a first inverter circuit which logic-reverses said first input signal and outputs said first input signal, the first delay element comprising a second inverter circuit which logic-reverses the first input signal and outputs the first input signal, and a third inverter circuit which logic-reverses the output of the second inverter circuit and outputs the output of the second inverter circuit, the first logical NAND element comprising a first NAND circuit which the outputs of the first inverter element and the first delay element are inputted to, the second logical NAND element comprising a second NAND circuit which the outputs of the first NAND element and the first or second logic value are inputted to, the second inverter element comprising a fourth inverter circuit which logic-reverses the output of the first inverter element and outputs the output of the first inverter element, the second delay element comprising a fifth inverter circuit which logic-reverses the output of the first inverter element and outputs the output of the first inverter element, and a sixth inverter circuit which logic-reverses the output of the fifth inverter circuit and outputs the output of the fifth inverter circuit, the third logical NAND element comprising a third NAND circuit which the outputs of the second inverter element and the second delay element are inputted to, and the fourth logical NAND element comprising a fourth NAND circuit which the outputs of the third logical NAND element and the first or second logic value are inputted to.

According to a ninth aspect of the present invention, a pulse generation circuit according to claim 4 comprises a first inverter element which the first input signal is inputted to, and logic-reverses the first input signal and outputs the first input signal, a first delay element which the first input signal is inputted to, and outputs the first input signal with delaying from the output of the first inverter element, a first logical AND element which the outputs of the first inverter element and the first delay element are inputted to, and outputs an AND of outputs of the first inverter element and the first delay element, a second inverter element which the output of the first inverter element is inputted to, and logic-reverses the output of the first inverter element and outputs the output of the first inverter element, a second delay element which the output of the first inverter element is inputted to, and outputs the output of the first inverter element with delaying from the output of the second inverter element, a second logical AND element which the outputs of the second inverter element and the second delay element are inputted to, and outputs an AND of outputs of the second inverter element and the second delay element, a third logical AND element which the outputs of the second logical AND element and the first logic value are inputted to, and when the second input signal is given, instead of the first logic value, the second logic value is inputted to, and outputs an AND of the output of the second logical AND element and the first or second logic value with delaying for the amount of first delay, a fourth logical AND element which logic-reversed the first logic value and the output of the first logical AND element are inputted to, and when the second input signal is given, instead of logic-reversed the first logic value, logic-reversed the second logic value is inputted to, and outputs an AND of the output of the first logical AND element and logic-reversed the first or second logic value with delaying for the amount of the first delay, a logical OR element which the outputs of the third and fourth logical AND elements are inputted to, and outputs an OR of the third and fourth logical AND elements with delaying for the amount of second delay, as the second pulse, and when the second input signal is given, outputs the first and the second pulses simultaneously, a third delay element which the output of the second logical AND element is inputted to, and outputs the output of the second logical AND element with delaying for the amount of the first delay, and a fourth delay element which the output of the third delay element is inputted to, and outputs the output of the third delay element with delaying for the amount of the second delay, as the first pulse.

According to a tenth aspect of the present invention, a pulse generation circuit according to claim 9, wherein the first inverter element comprises a first inverter circuit which logic-reverses the first input signal and outputs the first input signal, the first delay element comprising a second inverter circuit which logic-reverses the first input signal and outputs the first input signal, and a third inverter circuit which logic-reverses the output of the second inverter circuit and outputs the output of the second inverter circuit, the first logical AND element comprising a first NAND circuit which the outputs of the first inverter element and the first delay element are inputted to, and a fourth inverter circuit which the output of the first NAND circuit is inputted to, the second inverter element comprising a fifth inverter circuit which logic-reverses the output of the first inverter element and outputs the output of the first inverter element, the second delay element comprising a sixth inverter circuit which logic-reverses the output of the first inverter element and outputs the output of the first inverter element, and a seventh inverter circuit which logic-reverses the output of the sixth inverter circuit and outputs the output of the sixth inverter circuit, the second logical AND element comprising a second NAND circuit which the outputs of the second inverter element and the second delay element are inputted to, and an eighth inverter circuit which the output of the second NAND circuit is inputted to, the third logical AND element comprising a third NAND circuit which logic-reverses an AND of the output of the second logical AND element and the first or second logic value and outputs the AND, and a ninth inverter circuit which the output of the third NAND circuit is inputted to, the fourth logical AND element comprising a fourth NAND circuit which logic-reverses an AND of the output of the first logical AND element and logic-reversed the first or second logic value and outputs the AND, and a tenth inverter circuit which the output of the fourth NAND circuit is inputted to, the logical OR element comprising a first NOR circuit which logic-reverses an OR of the outputs of the third and fourth logical AND element and outputs the OR, and an eleventh inverter circuit which the output of the first NOR circuit is inputted to, the third delay element comprising a fifth NAND circuit which logic-reverses an AND of the output of the second logical AND element and the second logic value and outputs the AND, and a twelfth inverter circuit which the output of the fifth NAND circuit is inputted to, and the fourth delay element comprising a second NOR circuit which logic-reverses an OR of the output of the third delay element and the first logic value and outputs the OR, and a thirteenth inverter circuit which the output of the second NOR circuit is inputted to.

According to an eleventh aspect of the present invention, a drive circuit for driving a switching device comprises control means which control conductive condition of the switching device, pulse generation means which generates first and second pulse signals respectively corresponding to level transient of rising-up and falling-down of input signal, and level shifting means which level-shifts the first and second pulse signals to generate first and second level-shifted signals respectively corresponding to the first and second pulse signals, wherein the first pulse signal is on-signal which turns on the switching device, the second pulse signal is off-signal which turns off the switching device, the control means comprises control signal outputting means for outputting a control signal which keeps the switching device turning-on or turning-off depending on the first and second level-shifted signals, and protection means provided at pre-stage of the control signal outputting means for giving a predetermined signal to the control signal outputting means to keep the control signal outputting means outputting said control signal just before when the first and second level-shifted signals are given simultaneously, the control signal outputting means is a set-reset-flip-flop circuit, and the protection means is a protection circuit according to claim 1, the first and second input signals correspond to the first and second level-shifted signals respectively, the first output signal corresponds to set-signal to the set-reset-flip-flop circuit and the second output signal corresponds to reset-signal to the set-reset-flip-flop circuit.

According to a twelfth aspect of the present invention, a drive circuit according to claim 11 wherein the protection circuit comprises a first delay element which the first input signal is inputted to, and outputs the first input signal with delaying for the amount of first delay, a second delay element which the second input signal is inputted to, and outputs the second input signal with delaying for the amount of the first delay, a logical AND element which the first and second input signals are inputted to, and outputs an AND of the first and second input signals with delaying for the amount of the first delay, a third delay element which the output of the first delay element is inputted to, and outputs the output of the first delay element with delaying for the amount of second delay, a fourth delay element which the output of the logical AND element is inputted to, and outputs the output of the logical AND element with delaying for the amount of the second delay, a fifth delay element which the output of the second delay element is inputted to, and outputs the output of the second delay element with delaying for the amount of the second delay, a logical OR element which outputs of the logical AND element and the fourth delay element are inputted to, and outputs an OR of outputs of the logical AND element and the fourth delay element with delaying for the amount of the second delay, a first inverter element which the output of the third delay element is inputted to, and logic-reverses the output of the third delay element and outputs the output of the third delay element with delaying for the amount of third delay, a second inverter element which the output of the fifth delay element is inputted to, and logic-reverses the output of the fifth delay element and outputs the output of the fifth delay element with delaying for the amount of the third delay, a first logical NOR element which outputs of the logical OR element and the first inverter element are inputted to, and logic-reverses an OR of outputs of the OR element and the first inverter element and outputs the OR as the first output signal, and a second NOR element which outputs of the logical OR element and the second inverter element are inputted to, and logic-reverses an OR of outputs of the OR element and the second inverter element and outputs the OR as the second output signal, wherein the amount of the second delay is greater than the amount of the third delay.

According to a thirteenth aspect of the present invention, a drive circuit according to claim 12 wherein the first delay element comprises a first NAND circuit having input terminals both of which the first input signal is inputted to, and a first inverter circuit which the output of the first NAND circuit is inputted to, the second delay element comprising a second NAND circuit having input terminals both of which said second input signal is inputted to, and a second inverter circuit which the output of the second NAND circuit is inputted to, the logical AND element comprising a third NAND circuit which the first and the second input signals are inputted to, and a third inverter circuit which the output of the third NAND circuit is inputted to, the third delay element comprising a first NOR circuit which the output of the first delay element is inputted to both of input terminals, and a fourth inverter circuit which the output of the first NOR circuit is inputted to, the fourth delay element comprising a second NOR circuit which the output of the logical AND element is inputted to both of input terminals, and a fifth inverter circuit which the output of the second NOR circuit is inputted to, the fifth delay element comprising a third NOR circuit which the output of the second delay element is inputted to both of input terminals, and a sixth inverter circuit which the output of the third NOR circuit is inputted to, the logical OR element comprising a fourth NOR circuit which the outputs of the logical AND element and the fourth delay element are inputted to, and a seventh inverter circuit which the output of the fourth NOR circuit is inputted to, the first inverter element comprising an eighth inverter circuit which the output of the third delay element is inputted to, the second inverter element comprising a ninth inverter circuit which the output of the fifth delay element is inputted to, the first logical NOR element comprising a fifth NOR circuit which the outputs of the first inverter element and the OR element are inputted to, and the second logical NOR element comprising a sixth NOR circuit which the outputs of the second inverter element and the OR element are inputted to.

According to a fourteenth aspect of the present invention; a drive circuit for driving a switching device comprises control means which control conductive condition of the switching device, pulse generation means which generates first and second pulse signals respectively corresponding to level transient of rising-up and falling-down of input signal, level shifting means which level-shifts the first and second pulse signals to generate first and second level-shifted signals respectively corresponding to the first and second pulse signals, wherein the first pulse signal is on-signal which turns on the switching device, the second pulse signal is off-signal which turns off the switching device, the pulse generation means which is a pulse generation circuit according to claim 4, wherein the first input signal corresponds to the input signal and the first pulse corresponds to the first pulse signal, and the second pulse corresponds to the second pulse signal, the control means comprises control signal outputting means for outputting a control signal which keeps the switching device turning-on or turning-off depending on the first and second level-shifted signals, and protection means provided at pre-stage of the control signal outputting means for giving a predetermined signal to the control signal outputting means to keep the control signal outputting means outputting the control signal just before when the first and second level-shifted signals are given simultaneously.

According to a fifteenth aspect of the present invention, a drive circuit according to claim 14 wherein a pulse generation circuit comprises a first inverter element which the first input signal is inputted to, and logic-reverses the first input signal and outputs the first input signal, a first delay element which the first input signal is inputted to, and outputs the first input signal with delaying from the output of the first inverter element, a first logical AND element which the outputs of the first inverter element and the first delay element are inputted to, and outputs an AND of the outputs of the first inverter element and the first delay element, a first logical OR element which the output of the first logical AND element and the first logic value are inputted to, and when the second input signal is given, instead of the first logic value, the second logic value is inputted to, and outputs an OR of the output of the first logical AND element and the first logic value or the second logic value, as the second pulse, a second inverter element which the output of the first inverter element is inputted to, and logic-reverses the output of the first inverter element and outputs the output of the first inverter element, a second delay element which the output of the first inverter element is inputted to, and outputs the output of the first inverter element with delaying from the output of the second inverter element, a second logical AND element which the outputs of the second inverter element and the second delay element are inputted to, and outputs an AND of outputs of the second inverter element and the second delay element, a second logical OR element which the output of the second logical AND element and the first logic value are inputted to, and when the third input signal is given, instead of the first logic value, the second logic value is inputted to, and outputs an OR of the output of the second logical AND element and the first logic value or the second logic value as the first pulse.

According to a sixteenth aspect of the present invention, a drive circuit according to claim 15 wherein the first inverter element comprises a first inverter circuit which logic-reverses the first input signal and outputs the first input signal, the first delay element comprising a second inverter circuit which logic-reverses the first input signal and outputs the first input signal, and a third inverter circuit which logic-reverses the output of the second inverter circuit and outputs the output of the second inverter circuit, the first logical AND element comprising a first NAND circuit which the outputs of the first inverter element and the first delay element are inputted to, and a fourth inverter circuit which the output of the first NAND circuit is inputted to, the first logical OR element comprising a first NOR circuit which logic-reverses an OR of the output of the first logical AND element and the first or second logic value and outputs the OR, and a fifth inverter circuit which the output of the first NOR circuit is inputted to, the second inverter element comprising a sixth inverter circuit which logic-reverses the output of the first inverter element and outputs the output of the first inverter element, the second delay element comprising a seventh inverter circuit which logic-reverses the output of the first inverter element and outputs the output of the first inverter element, and an eighth inverter circuit which logic-reverses the output of the seventh inverter circuit and outputs the output of the seventh inverter circuit, the second logical AND element comprising a second NAND circuit which the outputs of the second inverter element and the second delay element are inputted to, and a ninth inverter circuit which the output of the second NAND circuit is inputted to, the second logical OR element comprising a second NOR circuit which logic-reverses of the output of the second AND element and the first or second logic value and outputs the OR, and a tenth inverter circuit which the output of the second NOR circuit is inputted to.

According to a seventeenth aspect of the present invention, a drive circuit according to claim 14 wherein the pulse generation circuit comprises a first inverter element which the first input signal is inputted to, and logic-reverses the first input signal and outputs the first input signal, a first delay element which the first input signal is inputted to, and outputs the first input signal with delaying from the output of the first inverter element, a first logical NAND element which the outputs of the first inverter element and the first delay element are inputted to, and logic-reverses an AND of outputs of the first inverter element and the first delay element and outputs the AND of the outputs of the first inverter element and the first delay element, a second logical NAND element which the output of the first logical NAND element and the second logic value are inputted to, and when the second input signal is given, instead of said second logic value, the first logic value is inputted to, and logic-reverses an AND of the output of the first logical NAND element and of the first or second logic value and outputs the AND as the second pulse, a second inverter element which the output of the first inverter element is inputted to, and logic-reverses the output of the first inverter element and outputs the output of the first inverter element, a second delay element which the output of the first inverter element is inputted to, and outputs the output of the first inverter element with delaying from the output of the second inverter element, a third logical NAND element which the outputs of the second inverter element and the second delay element are inputted to, and logic-reverses an AND of the outputs of the second inverter element and the second delay element and outputs the AND, a fourth logical NAND element which the outputs of the third logical NAND element and the second logic value are inputted to, and when the third input signal is given, instead of the second logic value, the first logic value is inputted to, and logic-reverses an AND of the output of the third logical NAND element and the first or second logic value and outputs the AND as the first pulse.

According to an eighteenth aspect of the present invention, a drive circuit according to claim 17, wherein the first inverter element comprises a first inverter circuit which logic-reverses the first input signal and outputs the first input signal, the first delay element comprising a second inverter circuit which logic-reverses the first input signal and outputs the first input signal, and a third inverter circuit which logic-reverses the output of the second inverter circuit and outputs the output of the second inverter circuit, the first logical NAND element comprising a first NAND circuit which the outputs of the first inverter element and the first delay element are inputted to, the second logical NAND element comprising a second NAND circuit which the outputs of the first logical NAND element and the first or second logic value are inputted to, the second inverter element comprising a fourth inverter circuit which logic-reverses the output of the first inverter element and outputs the output of the first inverter element, the second delay element comprising a fifth inverter circuit which logic-reverses the output of the first inverter element and outputs the output of the first inverter element, and a sixth inverter circuit which logic-reverses the output of the fifth inverter circuit and outputs the output of the fifth inverter circuit, the third logical NAND element comprising a third NAND circuit which the outputs of the second inverter element and the second delay element are inputted to, and the fourth logical NAND element comprising a fourth NAND circuit which the outputs of the third logical NAND element and the first or second logic value are inputted to.

According to a nineteenth aspect of the present invention, a drive circuit according to claim 14, wherein the pulse generation circuit comprises a first inverter element which the first input signal is inputted to, and logic-reverses the first input signal and outputs the first input signal, a first delay element which the first input signal is inputted to, and outputs the first input signal with delaying from the output of the first inverter element, a first logical AND element which the outputs of the first inverter element and the first delay element are inputted to, and outputs an AND of outputs of the first inverter element and the first delay element, a second inverter element which the output of the first inverter element is inputted to, and logic-reverses the output of the first inverter element and outputs the output of the first inverter element, a second delay element which the output of the first inverter element is inputted to, and outputs the output of the first inverter element with delaying from the output of the second inverter element, a second logical AND element which the outputs of the second inverter element and the second delay element are inputted to, and outputs an AND of outputs of the second inverter element and the second delay element, a third logical AND element which the outputs of the second AND element and the first logic value are inputted to, and when the second input signal is given, instead of the first logic value, the second logic value is inputted to, and outputs an AND of the output of the second logical AND gate and the first or second logic value with delaying for the amount of first delay, a fourth logical AND element which logic-reversed the first logic value and the output of the first logical AND element are inputted to, and when the second input signal is given, instead of logic-reversed the first logic value, logic-reversed the second logic value is inputted to, and outputs an AND of the output of the first logical AND element and logic-reversed the first or second logic value with delaying for the amount of said first delay, a logical OR element which the outputs of the third and fourth logical AND elements are inputted to, and outputs an OR of the third and fourth logical AND elements with delaying for the amount of the second delay, the second pulse, and when the second input signal is given, outputs the first and the second pulses simultaneously a third delay element which the output of the second logical AND element is inputted to, and outputs the output of the second logical AND element with delaying for the amount of the first delay, and a fourth delay element which the output of the third delay element is inputted to, and outputs the output of the third delay element with delaying for the amount of the second delay, as the first pulse.

According to a twentieth aspect of the present invention, a drive circuit according to claim 19, wherein the first inverter element comprises a first inverter circuit which logic-reverses the first input signal and outputs the first input signal, the first delay element comprising a second inverter circuit which logic-reverses the first input signal and outputs the first input signal, and a third inverter circuit which logic-reverses the output of the second inverter circuit and outputs the output of the second inverter circuit, the first logical AND element comprising a first NAND circuit which the outputs of the first inverter element and the first delay element are inputted to, and a fourth inverter circuit which the output of the first NAND circuit is inputted to, the second inverter element comprising a fifth inverter circuit which logic-reverses the output of the first inverter element and outputs the output of the first inverter element, the second delay element comprising a sixth inverter circuit which logic-reverses the output of the first inverter element and outputs the output of the first inverter element, and a seventh inverter circuit which logic-reverses the output of the sixth inverter circuit and outputs the output of the sixth inverter circuit, the second logical AND element comprising a second NAND circuit which the outputs of the second inverter element and the second delay element are inputted to, and an eighth inverter circuit which the output of the second NAND circuit is inputted to, the third logical AND element comprising a third NAND circuit which logic-reverses an AND of the output of the second logical AND element and the first or second logic value and outputs the AND, and a ninth inverter circuit which the output of the third NAND circuit is inputted to, the fourth logical AND electrode comprising a fourth NAND circuit which logic-reverses an AND of the output of the first logical AND element and logic-reversed the first or second logic value and outputs the AND, and a tenth inverter circuit which the output of the fourth NAND circuit is inputted to, the logical OR element comprising a first NOR circuit which logic-reverses an OR of the outputs of the third and fourth logical AND element and outputs the OR, and an eleventh inverter circuit which the output of the first NOR circuit is inputted to, the third delay element comprising a fifth NAND circuit which logic-reverses an AND of the output of the second logical AND element and the second logic value and outputs the AND, and a twelfth inverter circuit which the output of the fifth NAND circuit is inputted to, and the fourth delay element comprising a second NOR circuit which logic-reverses an OR of the output of the third delay element and the first logic value and outputs the OR, and a thirteenth inverter circuit which the output of the second NOR circuit is inputted to.

These and other objects, features, aspects, and advantages of the present invention will become more apparent from the following detailed description of the present invention when taken in conjunction with the accompanying drawings.

BRIEF DISCRIPTION OF THE DRAWINGS

DESCRIPTION OF THE PREFERRED EMBODIMENT

First Preferred Embodiment

Figure 1:
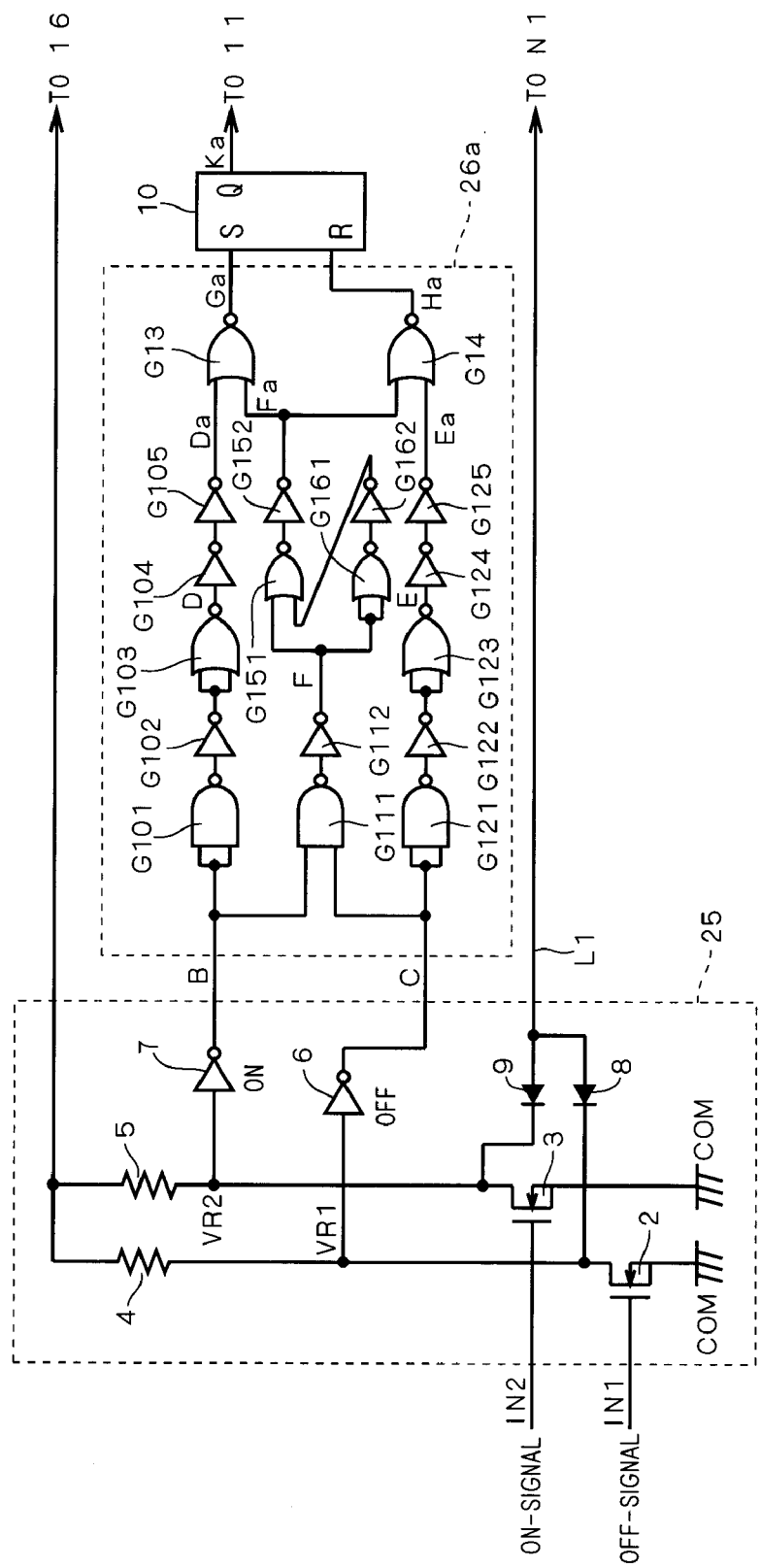
FIG. 1 shows a protection circuit showing in the first preferred embodiment according to the present invention.
Figure 7:
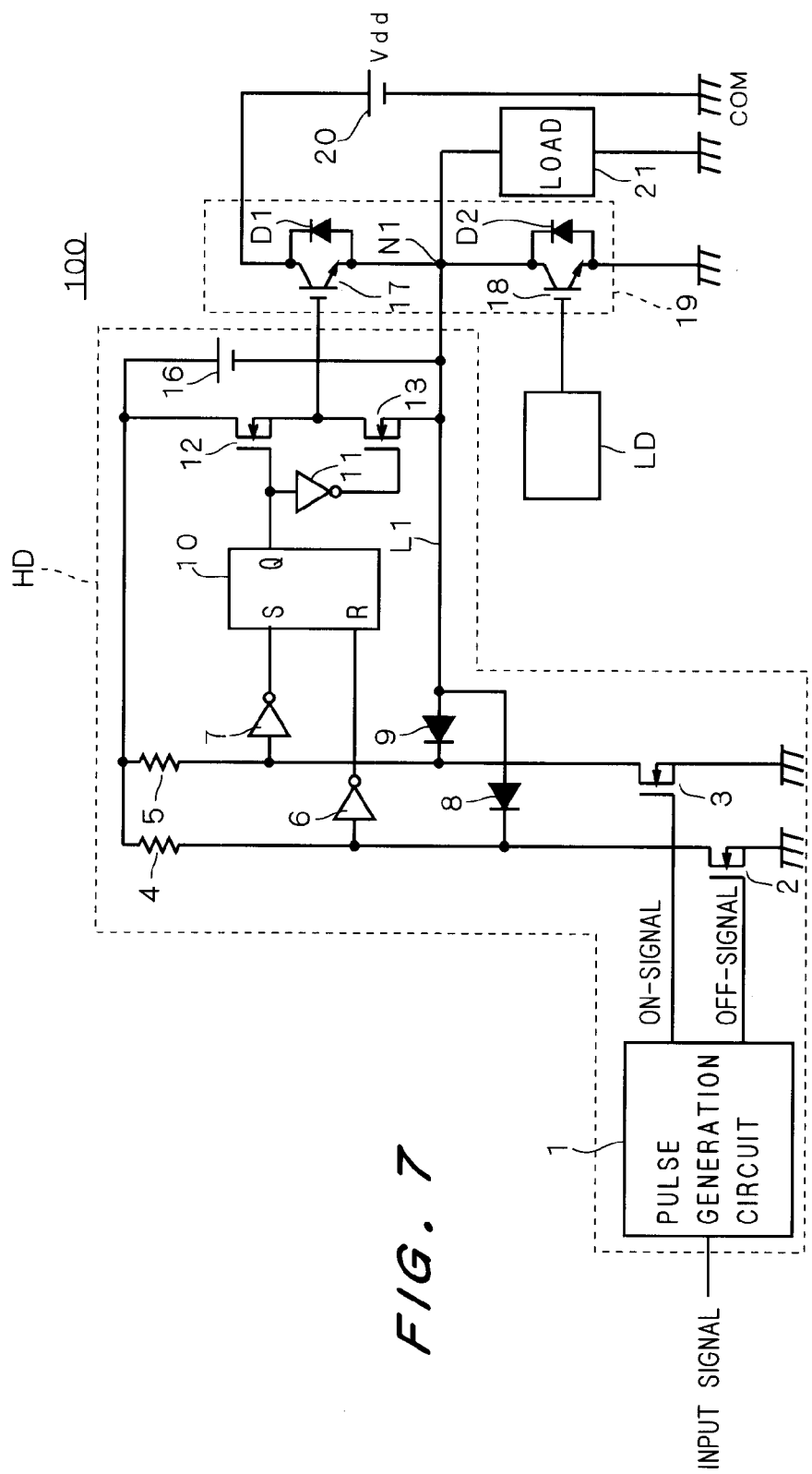
FIG. 7 shows a semiconductor device having a drive circuit of the power device.
Figure 8:
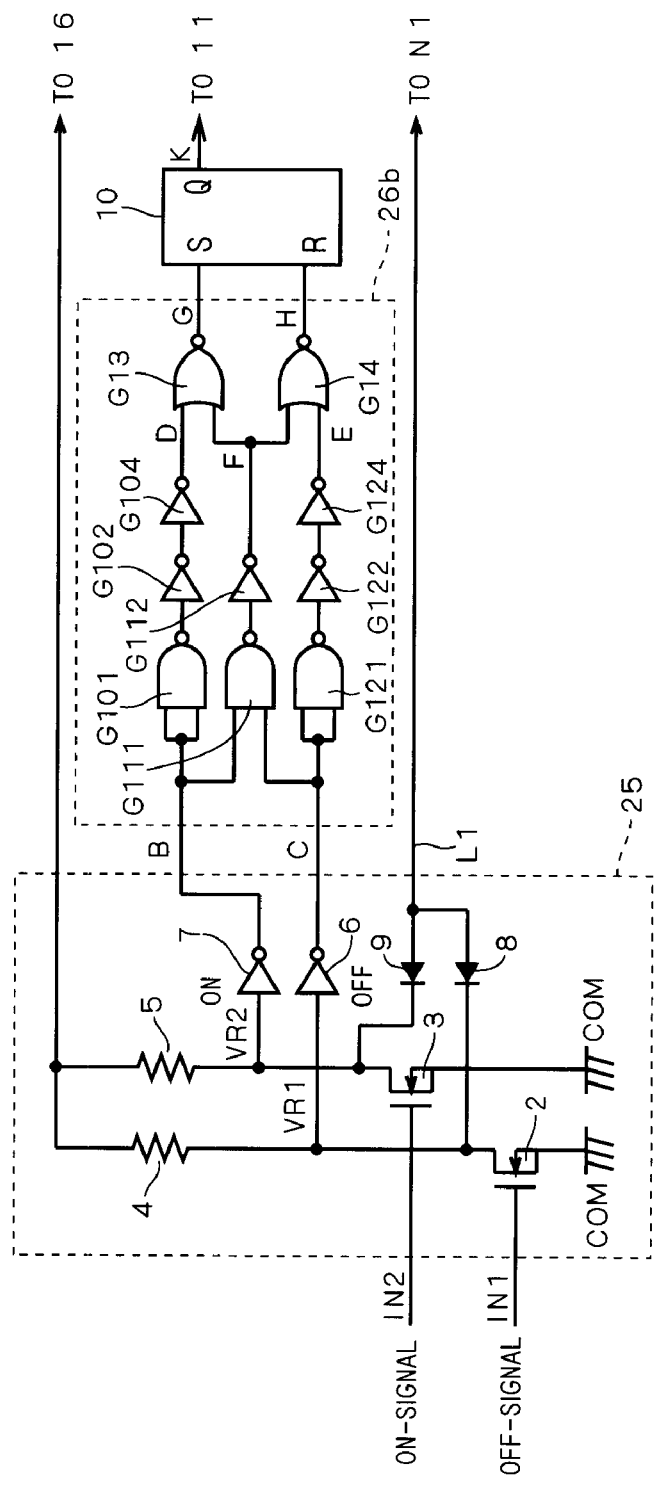
FIG. 8 shows a conventional protection circuit in a drive circuit of the power device.
Figure 9:
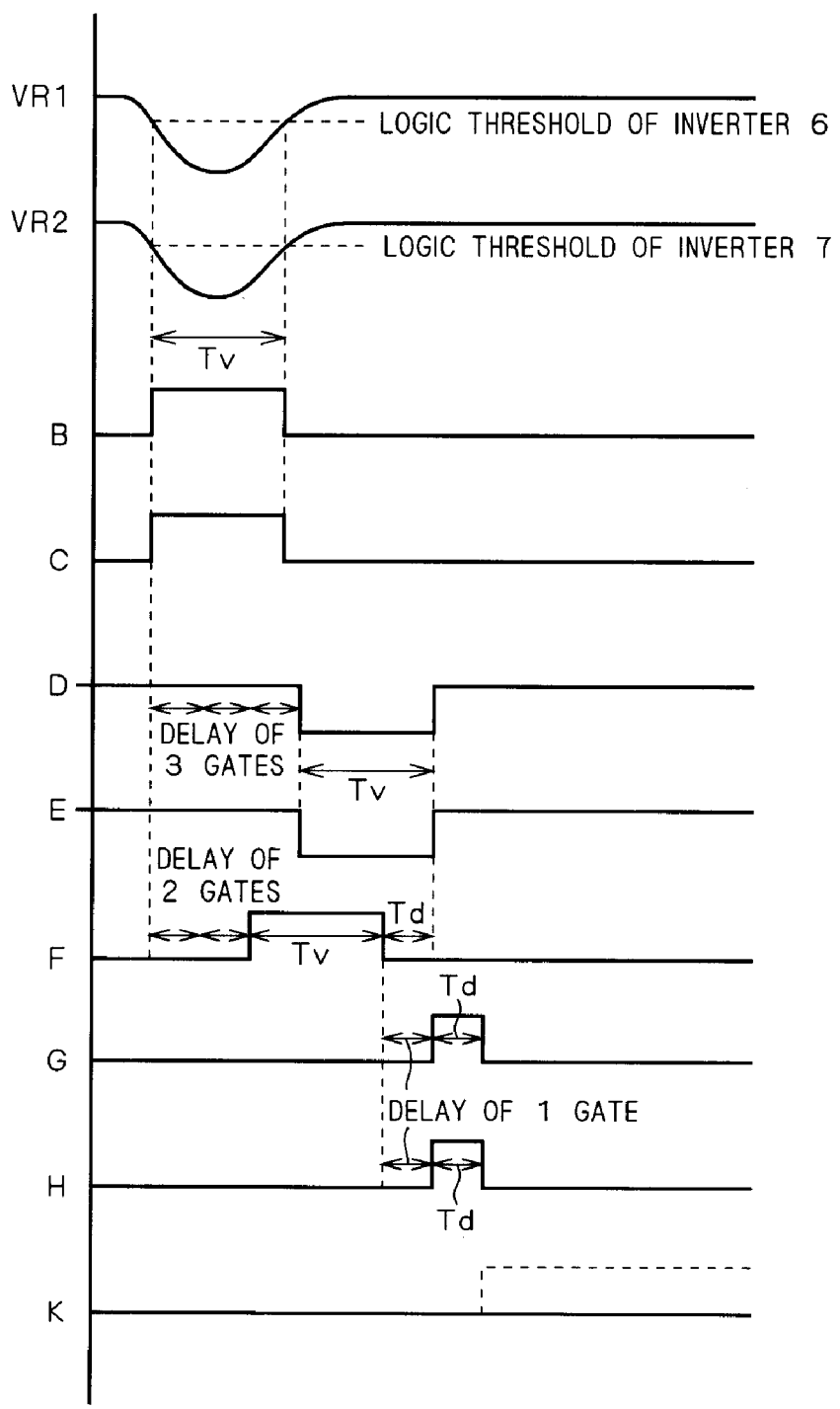
FIG. 9 is a timing chart of a conventional protection circuit.

According to the preferred embodiment, its object is providing the protection circuit, which never inputs simultaneously set-signal and reset-signal to the set-reset-flip-flop circuit. FIG. 1 shows the protection circuit 26a, showing the first preferred embodiment according to the present invention. The circuit composition around the protection circuit 26a is same as the semiconductor device 100 having the drive circuit of the power device, shown in FIG. 7 and FIG. 8.

In FIG. 1, the output of the inverter circuit 7 (the circuit is indicated by "on", because the circuit is connected to the HNMOS transistor 3 inputted on-signals) is inputted to both of input terminals of the NAND circuit G101 in the protection circuit 26a at first. Also, the output of the inverter circuit 6 (the circuit is indicated by "off", because the circuit is connected to the HNMOS transistor 2 inputted off-signals) is inputted to both of input terminals of the NAND circuit G121 in the protection circuit 26a (therefore, the NAND circuits G101, G121 function as inverter circuits). Moreover, both of outputs of the inverter circuits 6,7 are inputted to the NAND circuit G111, too. The output of the NAND circuit G101 is inputted to the inverter circuit G102, and the output of the NAND circuit G111 is inputted to the inverter circuit G112, and the output of the NAND circuit G121 is inputted to the inverter circuit G122.

The output of the inverter circuit G102 is inputted to both of input terminals of the NOR circuit G103, and the output of the inverter circuit G122 is inputted to both of input terminals of the NOR circuit G123 (therefore, the NOR circuits G103, G123 function as inverter circuits). Also, the output of the NOR circuit 103 is inputted to the inverter circuit G104, and the output of the NOR circuit 123 is inputted to the inverter circuit G124. Moreover, the output of the inverter circuit G104 is inputted to the inverter circuit G105, and the output of the inverter circuit G124 is inputted to the inverter circuit G125.

The output of the inverter circuit G112 is inputted to both of input terminals of the NOR circuit G161, and the output is inputted to one input terminal of the NOR circuit G151, too (therefore, the NOR circuit G161 functions as an inverter circuit). The output of the NOR circuit G161 is inputted to the inverter circuit G162, and the output of the inverter circuit G162 is inputted to other input terminal of the NOR circuit G151. Moreover, the output signal of the NOR circuit G151 is inputted to the inverter circuit G152.

Outputs of the inverter circuits G105, G152 are inputted to the NOR circuit G13, and outputs of the inverter circuits G125, G152 are inputted to the NOR circuit G14. The output of the NOR circuit G13 is the set signal to the set-reset-flip-flop circuit 10 and the output of the NOR circuit 14 is the reset signal to the set-reset-flip-flop circuit 10.

Next, following description explains about the operation of the protection circuit 26a. In the present invention, for convenience' sake, it adopts the active High, but it can adopt the active Low.

At first, in the pulse generation circuit 1, it is assumed that on-signal and off-signal are not outputted. In the case, the electric potentials at VR1 and VR2, is same as the electric potential of high electric potential side power source 16, "H" is inputted to the inverter circuits 6,7. Therefore, the inverter circuits 6,7 reverse "H" and output "L", output signals "L" are inputted to the NOR circuit G13, G14 as "H" finally through the line of the NAND circuit G101 to the inverter circuit G105 and the line of the NAND circuit G121 to the inverter circuit G125. On the other hand, output signal "L" of the inverter circuits 6,7 are inputted to the NAND circuit G111, so the NAND circuit G111 outputs "H", and the signal "H" is reversed by the inverter circuit G112 and becomes "L", the output "L" of the inverter circuit G112 is logic-reversed by the NOR circuit G161 and the inverter circuit G162, so "H" returns to "L", and after all, "L" is inputted to both of the NOR circuit G151. Therefore, the NOR circuit G151 outputs "H", the output "H" is reversed by the inverter circuit G152 and becomes "L".

Therefore, in the case that on-signal and off-signal are not outputted from the pulse generation circuit 1, "H" and "L" are inputted to the NOR circuits G13, G14, so both of outputs of the NOR circuits G13, G14 are "L".

Next, it is assumed that the power device 17 is turned to be on. At first, the pulse generation circuit 1 outputs the signal which generates the electric potential of "H" as a pulsed on-signal, and the signal which has the electric potential of "L" as an off-signal. Therefore, voltage drop occurs at the resistance 5 connected to the HNMOS transistor 3, and the pulsed signal "L" is inputted to the inverter circuit 7. On the other hand, voltage drop does not occur at the resistance 4 connected to the HNMOS transistor 2, so "H" is inputted to the inverter circuit 6 as well as above.

Therefore, in the case that on-signal is generated from the pulse generation circuit 1, the input signal to one input terminal of the NAND circuit G111 is "L", and the input signal to other input terminal of the NAND circuit G111 is "H". Therefore, the output of the NAND circuit G111 is "H". However, the output of the NAND circuit G111 "H" have same condition that outputs of the inverter circuits 6,7 are "L", so the output of the inverter circuit G112 is still "L" and has not changed. As a result, the output signal of the inverter circuit G162 through the NOR circuit G161, is "L", both of inputs of the NOR circuit G151 are "L", so the output of the NOR circuit G151 is still "H". Therefore, the output of the inverter circuit G152 is still "L", too.

Therefore, the change of signals to the set-reset-flip-flop circuit 10 by on-signal, is only the set signal from the NOR circuit G13, generating by logic-reversing in line of the NAND circuit G101 to the inverter circuit G105. In short, the pulsed signal "H" from the inverter circuit 7 is inputted to the inverter circuit G101, and the signal is logic-reversed and passes the inverter circuits G102 to G105, one input of the NOR circuit G13 becomes the pulsed signal "L". The output of the inverter circuit G152 is "L", so the NOR circuit G13 outputs the pulsed signal "H". On the other hand, the output of the inverter circuit 6 is still "L", and the output of the NOR circuit G14 through the NAND circuit G121 to the inverter circuit G125, is still "L", even if the signal is logic-reversed.

Next, it is assumed that the power device 17 is turned to be off. That case can be regarded as the change of signal in the case of on-signal from the pulse generation circuit 1, occurs in line of the NAND circuit G121 to the inverter circuit G125, instead of the line of the NAND circuit G101 to the inverter circuit G105, and after all, the NOR circuit G14 outputs the pulsed signal "H", and the output of the NOR circuit G13 is still "L".

The operation of the protection circuit 26a in the case that on-signal and off-signal are normally given, has already been explained by above sentences. Next, the following description will explain about the operation of the protection circuit 26a, in the case that the dv/dt transient signal occurs, by using FIG. 2. At first, the dv/dt transient signal is applied in the line L1, the dv/dt electric current which is the product of the parasitic capacity C between the drain and source of HNMOS transistors 2, 3, and the dv/dt transient signal, flows simultaneously to HNMOS transistors 2 and 3. The dv/dt electric current has the same electric current intensity as the electric current flowing in ordinary switching, so voltage drops occur simultaneously in resistances 4 and 5, "H" is outputted from the inverter circuits 6, 7. In short, it can be considered that instead of on-signal and off-signal from the pulse generation circuit 1, the dv/dt transient signal is given simultaneously to the inverter circuits 6, 7. C and B shown in FIG. 2 indicate changes of signals at output terminals of the inverter circuits 6 and 7. Also, in FIG. 2, the change of electric potential of the resistance 4 at the edge of the HNMOS transistor 2 is indicated by VR1, and the change of electric potential of the resistance 5 at the edge of the HNMOS transistor 3 is indicated by VR2, and periods when VR1 and VR2 are lower than the logic threshold of the inverter circuits 6,7, are indicated by Tv.

In above case, "H" is inputted simultaneously to both of input terminals of the NAND circuit G111, so the NAND circuit G111 outputs "L". The inverter circuit G112 reverses "L" which is outputted from the NAND circuit G111, and it outputs signal as "H". F shown in FIG. 2, shows the change of electric potential at output terminal of the inverter circuit G112, and shows that the change of electric potential at F is delayed for two gates of the NAND circuit G111 and the inverter circuit G112, from the change of signal at B and C.

The output signal "H" of the inverter circuit G112 is inputted to one input terminal of the NOR circuit G151, whose output signal until then "H" changes to "L". And, the change of output of the NOR circuit G151 makes one input of the NOR circuit G13 change from "L" to "H" through the inverter circuit G152. Fa shown in FIG. 2, shows the change of electric potential at the output terminal of the inverter circuit G152, and shows that the change of electric potential at Fa is delayed for four gates of the NAND circuit G111, the inverter circuit G112, the NOR circuit G151 and the inverter circuit G152, from the changes of signal at B and C.

Figure 2:
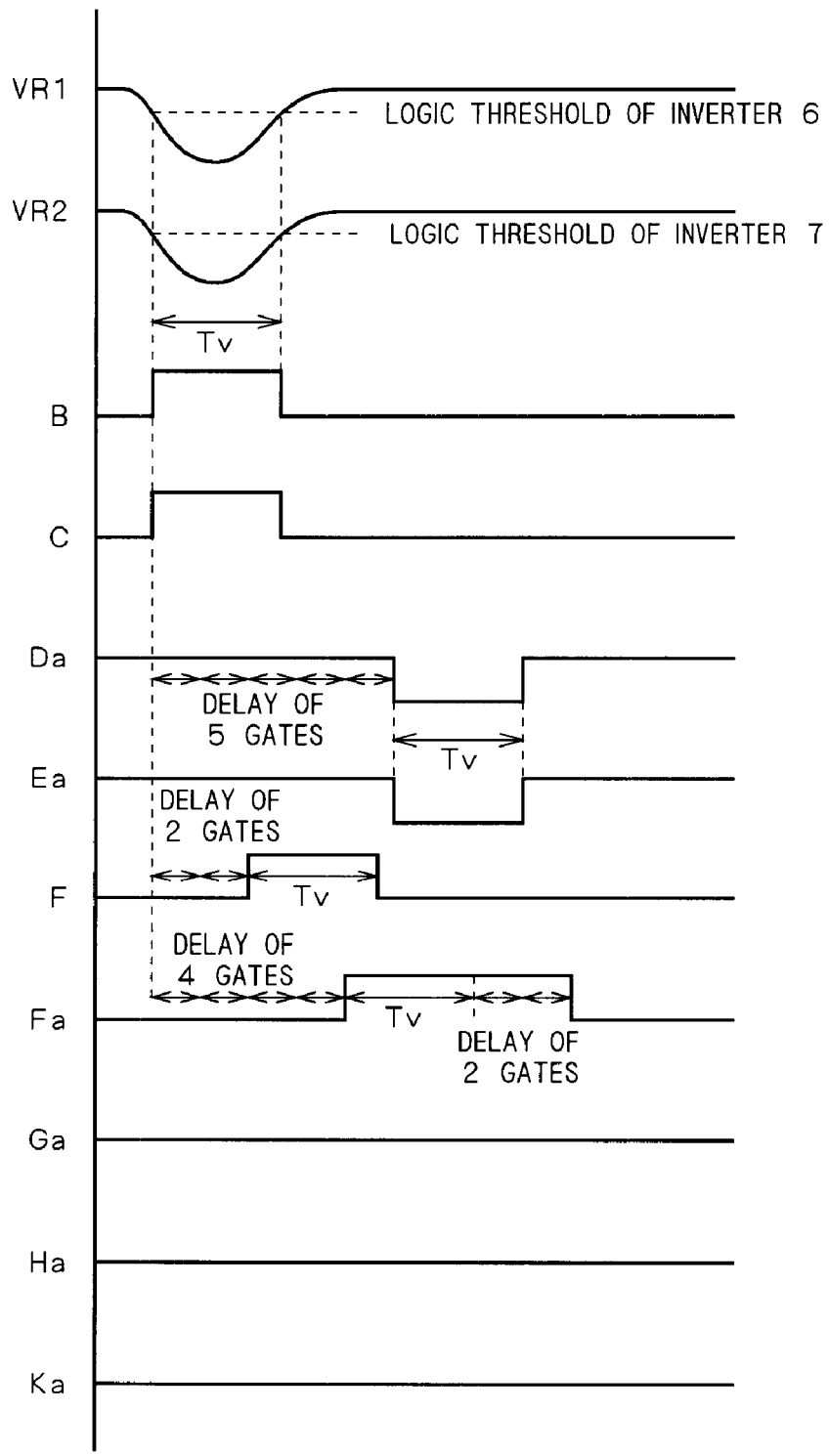
FIG. 2 is a timing chart of a protection circuit showing in the first preferred embodiment according to the present invention.

Also, the changes of outputs of the inverter circuits 6, 7 are sent to the line of the NAND circuit G101 to the inverter circuit G105 and the NAND circuit G121 to the inverter circuit G125 one after another, the changes of signal from "H" to "L" at Da and Ea which are output terminals of the inverter circuit G105 and G125, are delayed for five gates of the NAND circuit G101 to the inverter circuit G105 or the NAND circuit G121 to the inverter circuit G125, from the changes of signals at B and C, as shown in FIG. 2.

When the dv/dt transient signal disappears, "L" is outputted from the inverter circuits 6,7 again. Then, the changes of the output signals of the inverter circuits 6, 7 are sent to the line of the NAND circuit G101 to the inverter circuit G105 and the line of the NAND circuit G121 to the inverter circuit G125 one after another as well as above, as shown in FIG. 2, the changes of signal from "L" to "H" at Da and Ea are delayed for five gates from the changes of signals at B and C. "L" is inputted simultaneously to both of input terminals of the NAND circuit G111, so the NAND circuit G111 outputs "H". And, the inverter circuit G112 reverses "H" which is outputted from the NAND circuit G111, and it outputs the signal as "L".

The output of the inverter circuit G112 "L" is inputted to one input terminal of the NOR circuit G151. This case is different from said case of occurring the dv/dt transient signal, the output signal "L" of the NOR circuit G151 until then, never changes to "H". Because the output of the inverter circuit G162 has changed from "L" to "H" by the change of signal in said case of occurring of the dv/dt transient signal, the output of the NOR circuit G151 can not change even if the output of the inverter circuit G112 changes to "L". Therefore, the change "H" to "L" of the inverter circuit G152, as shown in FIG. 2, does not occur before the change "H" to "L" at F passes through for two gates of the NOR circuit G161 and the inverter circuit G162.

In short, in said structure, the output of the inverter circuit G105 (Da) and the output of the inverter circuit G125 (Ea) and the output of the inverter circuit G152 (Fa), simultaneously can not be "L". Because, as shown in FIG. 2, it is found that the change "L" to "H" at Fa (assert) occurs in advance surely for one gate from the change "H" to "L" at Da and Ea, and the change "H" to "L" at Fa (negate) delays surely for one gate from the change "L" to "H" at Da and Ea. Therefore, the outputs of the inverter circuits G105, G125 and the output of the inverter circuit G152 do not become "L" at the same time, so the NOR circuits G13 and G14 never output "H".

Therefore, if the dv/dt transient signal occurs, the set signal and the reset signal are not outputted to the set-resetflip-flop circuit 10 simultaneously, so mis-operations of the set-reset-flip-flop circuit 10 never occurs.

More, it is assumed that the amount of gate delay in the NAND circuits is equal to the amount of gate delay in the NOR circuits and the amount of gate delay of the inverter circuits to show easily in figs, but in fact, each of the amount of gate delay is different in every sort of logic circuits.

However, as shown in above structure, said structure having same kind of circuits in parallel at each stage from input stage, it is possible to match the amount of gate delay in each line in parallel, and to prohibit outputting pulses from the NOR circuits G13, G14 surely when output pulses of the inverter circuits 6, 7 are inputted simultaneously. More, at that time, each amount of delay in the inverter circuits G105, G125 must not become bigger than the sum of the amount of delay in the NOR circuit G161 and the amount of delay in the inverter circuit G162, otherwise the outputs of the inverter circuits G105, G125 and the output of the inverter circuit G152 are become "L" simultaneously, so it is impossible to achieve the object of the present invention.

If the protection circuit according to the preferred embodiment is used, when pulses outputted from the inverter circuits 6, 7 are inputted at different time, each pulses can be reversed from the NOR circuit G13, G14 and be outputted. Also, when outputted pulses of the inverter circuit 6, 7 are inputted simultaneously, the output of the inverter circuit G152 asserts faster than the outputs of the inverter circuits G105, G125 and the output of the inverter circuit G152 negates later than the outputs of the inverter circuits G105, G125, so the pulse is not outputted from the NOR circuits G13, G14. Therefore, it functions as the protection circuit for the input signal to the set-reset-flip-flop circuit 10. Also, even if the outputs of the inverter circuits 6, 7 are given simultaneously because of the dv/dt transient signal occurring in operating of the power device 17, 18, in short, even if in abnormal case that on-signal and off-signal are given simultaneously, simultaneous pulses from the NOR circuit G13, G14 of the protection circuit can be prevented by applying the protection circuit according to the preferred embodiment, to the drive circuit of the power device. Therefore, it is possible to prevent mis-operations of the set-reset-flip-flop circuit 10.

Also, if the pulse generation circuit according to the preferred embodiment is used, it is possible to achieve the object of the present invention using NAND circuits, NOR circuits and inverter circuits, and it is suitable for integrated circuit. Moreover, the structure has same kind of logic elements in parallel at each stage from input stage, so it is possible to match the amount of gate delay in each line in parallel, and when pulses are inputted from the inverter circuit 6, 7 simultaneously, it is possible to prevent outputting pulses from the NOR circuit G13, G14 surely.

More, in the structure of the protection circuit according to the preferred embodiment, the NAND circuit G101 and the inverter circuit G102 compose one unit, and the unit equals to the structure composing one delay device having a certain amount of delay, and the NAND circuit G121 and the inverter circuit G122, the NOR circuit G103 and the inverter circuit G104, the NOR circuit G123 and the inverter circuit G124, the NOR circuit G161 and the inverter circuit G162, compose each one unit, as well as above, and they equal to the structure composing one delay device having a certain amount of delay. Moreover, the NAND circuit G111 and the inverter circuit G112 compose one unit, and it equals to the structure composing one AND device having a certain amount of delay, the NOR circuit G151 and the inverter circuit G152 compose one unit, and it equals to the structure composing one OR device having a certain amount of delay. And it is found that in these delay devices, AND devices and OR devices, logic elements in parallel at each stage from input stage, have same amount of delay.

Second Preferred Embodiment

Figure 3:
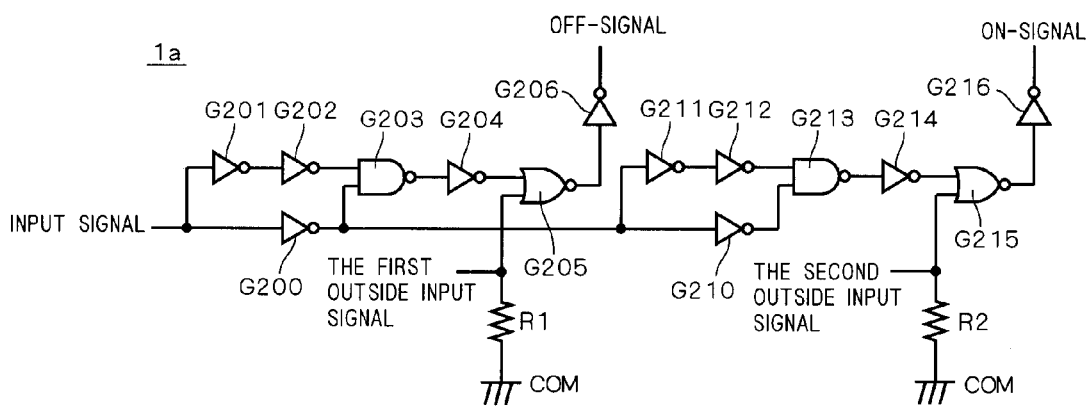
FIG. 3 shows a pulse generation circuit showing in the second preferred embodiment according to the present invention.

According to the preferred embodiment, it is possible to provide the pulse generation circuit, which can generate simultaneously on-signal and off-signal for test. FIG. 3 shows the pulse generation circuit 1a according to the second preferred embodiment. The circuit composition around the pulse generation circuit 1a is same as the semiconductor device 100 having the drive circuit of the power device, shown in FIG. 7 and FIG. 8.

In FIG. 3, the input signal is inputted to the inverter circuit G200 in the pulse generation circuit 1a, at first. Also, the input signal is inputted to the inverter circuit G201, too, and the output of the inverter circuit G201 is inputted to the inverter circuit G202.

And outputs of the inverter circuit G200 and the inverter circuit G202 are inputted to the NAND circuit G203. And the output of the NAND circuit G203 is reversed by the inverter circuit G204.

The output of the inverter circuit G204 is given to one input terminal of the NOR circuit G205. The ground electric potential COM is given to other input terminal of the NOR circuit G205 through the resistance R1. Also, the first outside input signal is given to one terminal of the resistance R1 on the NOR circuit G205 side, and it makes the electric potential of other terminal of the NOR circuit G205 change.

More, the output of the NOR circuit G205 is reversed by the inverter circuit G206, and the output of the inverter circuit G206 functions as off-signal.

Also, the output of the inverter circuit G200 is inputted to the inverter circuit G210 and the inverter circuit G211, and the output of the inverter circuit G211 is inputted to the inverter circuit G212.

And, outputs of the inverter circuit G210 and the inverter circuit G212 are inputted to the NAND circuit G213. And, the output of the NAND circuit G213 is reversed by the inverter circuit G214.

The output of the inverter circuit G214 is given to one input terminal of the NOR circuit G215, the ground electric potential COM is given to other input terminal of the NOR circuit G215 through the resistance R2. Also, the second outside input signal is given to one terminal of the resistance R2 on the NOR circuit G215 side, and it makes the electric potential of other terminal of the NOR circuit G215 change.

Moreover, the output of the NOR circuit G215 is reversed by the inverter circuit G216, the output of the inverter circuit G216 functions as on-signal.

Figure 10:
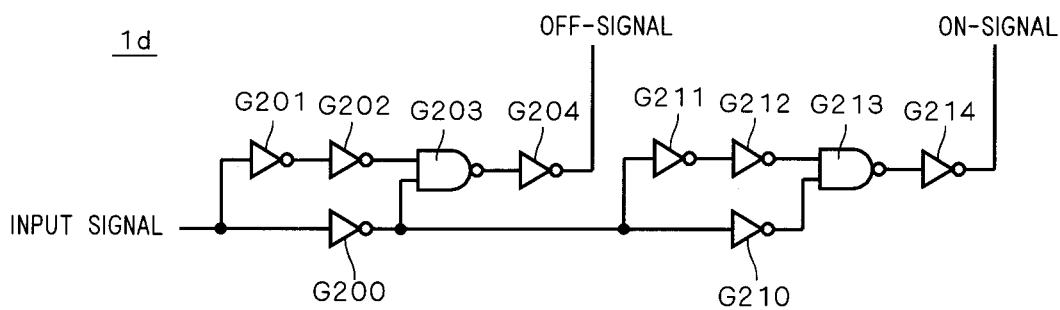
FIG. 10 shows a conventional pulse generation circuit in a drive circuit of the power device.
Figure 11:
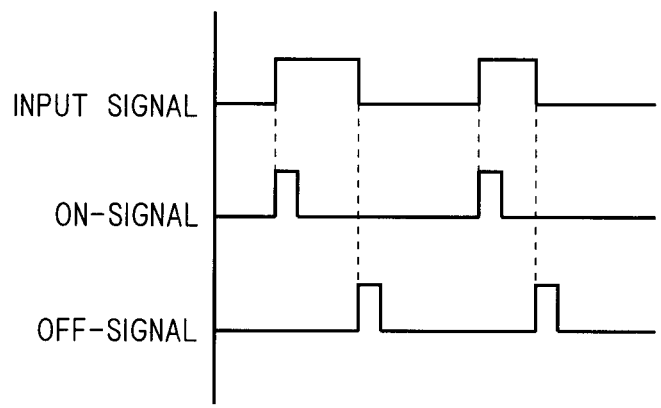
FIG. 11 is a timing chart of a conventional pulse generation circuit.

A following description explains about the operation of the pulse generation circuit 1a. At first, when the first and second outside input signals are not inputted, (in short, when the first and second outside input signals are "L"), the ground electric potential COM (its electric potential corresponds to the electric potential of "L") is given to the NOR circuits G205, G215 through the resistances R1, R2, so the NOR circuits G205, G215 function as ordinary inverter circuits. And, when both of the inverter circuit G206 and G216 are considered, too, it is possible to think that the NOR circuit G205 and the inverter circuit G206 compose one unit and it is a delay device. It is possible to think that the NOR circuit G215 and the inverter circuit G216 compose one unit and it is a delay device as well as above. Therefore, in the case, the pulse generation circuit 1a has same structure as the conventional pulse generation circuit 1d shown in FIG. 10.

In above case, the operation of the pulse generation circuit 1a is same as the operation of the conventional pulse generation circuit 1d, the NAND circuit G203 generates the pulsed "L" corresponding to the difference of the spread time of change of input signal "H" to "L", passing through the inverter G200, the inverter circuit G201 and G202, so the pulsed "L" is reversed to the pulsed "H" by the inverter circuit G204, and the off-signal is generated. Also, as well as above, the NAND circuit G213 generates the pulsed "L" corresponding to the difference of the spread time of change of input signal "L" to "H", passing through the inverter G210, the inverter circuit G211 and G212, so the pulsed "L" is reversed to the pulsed "H" by the inverter circuit G214, and the on-signal is generated.

On the other hand, when the first and second outside input signals are inputted, (in short, the first and second outside input signals are the pulsed "H"), the electric potentials which are higher than the ground electric potential COM by electric potentials of the first and second outside input signals, are given to the NOR circuits G205, G215, so regardless of the condition of input signals, on-signals and off-signals can be outputted. Therefore, on-signals and off-signals can be generated simultaneously for the test of the dv/dt transient signal.

It is possible to take out pulses corresponding to the direction of level transition of input signals from each inverter circuits G206, G216 using the pulse generation circuit according to the preferred embodiment. Also, the first and second outside input signals are given, so it is possible to take out signals corresponding to the period of giving the first and second outside input signals from the inverter circuits G206, G216, and if the first and second outside input signals are given simultaneously, it is possible to take out output signals simultaneously from the inverter circuits G206, G216. Also, if the pulse generation circuit according to the preferred embodiment is applied to the drive circuit of the power device, it is possible to output the pulse signals simultaneously to the HNMOS transistors 2, 3, and give outputs of the inverter circuits 6, 7 simultaneously for test to the protection circuit.

Also, if the pulse generation circuit according to the preferred embodiment is used, it is possible to achieve the object of the present invention using NAND circuits, NOR circuits and inverter circuits, and it is suitable for integrated circuit.

More, in the structure of the pulse generation circuit according to the preferred embodiment, the inverter circuits G201 and G202 compose one unit, and it equals to the structure composing one delay device having a certain amount of delay, and the inverter circuits G211 and G212 compose one unit, and it equals to the structure composing one delay device having a certain amount of delay as well as above. Also, the NAND circuit G203 and the inverter circuit G204 compose one unit, and it equals to the structure composing one AND device, the NOR circuit G205 and the inverter circuit G206 compose one unit, and it equals to the structure composing one OR device, as well as above. As for the NAND circuit G213 and the inverter circuit G214, the NOR circuit G215 and the inverter circuit G216 as well, it is the same.

Third Preferred Embodiment

Figure 4:
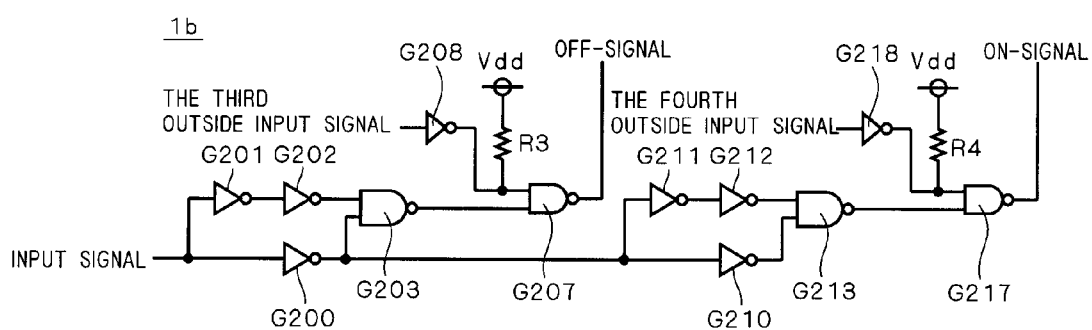
FIG. 4 shows a pulse generation circuit showing in the third preferred embodiment according to the present invention.

According to the preferred embodiment, it is possible to provide the pulse generation circuit, which can generate simultaneously on-signal and off-signal for test, too. FIG. 4 shows the pulse generation circuit 1b showing in the third preferred embodiment according to the present invention. The circuit composition around the pulse generation circuit 1b is same as the semiconductor device 100 having the drive circuit of the power device, shown in FIG. 7 and FIG. 8.

In FIG. 4, the input signal is inputted to the inverter circuit G200 in the pulse generation circuit 1b at first. The input signal is inputted to the inverter circuit G201, too, and the output of the inverter circuit G201 is inputted to the inverter circuit G202.

And outputs of the inverter circuit G200 and the inverter circuit G202 are inputted to the NAND circuit G203.

The output of the NAND circuit G203 is given to one input terminal of the NAND circuit G207. The power source electric potential Vdd is given to other input terminal of the NAND circuit G207 through the resistance R3. Also, the third outside input signal is given to one terminal of the resistance R3 on the NAND circuit G207 side through the inverter circuit G208, and it makes electric potential of other terminal of the NAND circuit G207 change.

More, the output of the NOR circuit G207 functions as off-signal.

Also, the output of the inverter circuit G200 is inputted to the inverter circuit G210 and the inverter circuit G211, too, and the output of the inverter circuit G211 is inputted to the inverter circuit G212.

And, outputs of the inverter circuit G210 and the inverter circuit G212 are inputted to the NAND circuit G213.

The output of the NAND circuit G213 is given to one input terminal of the NAND circuit G217. The power source electric potential Vdd is given to other input terminal of the NAND circuit G217 through the resistance R4. Also, the forth outside input signal is given to one terminal of the resistance R4 on the NAND circuit G217 side, and it makes the electric potential of other input terminal of the NAND circuit G217 change.

More, the output of the NAND circuit G217 functions as on-signal.

A following description explains about the operation of the pulse generation circuit 1b. At first, when the third and forth outside input signals are not inputted, (in short, when the third and fourth outside input signals are "L"), the power source electric potential Vdd (its electric potential corresponds to the electric potential of "H") is given to the NAND circuits G207, G217 through the resistances R3 or R4, so the NAND circuits G207, G217 function as ordinary inverter circuits. Therefore, in the case, the pulse generation circuit 1b has same structure as the conventional pulse generation circuit 1d shown in FIG. 10.

In above case, the operation of the pulse generation circuit 1b is same as the operation of the conventional pulse generation circuit 1d, the NAND circuit G203 generates the pulsed "L" corresponding to the difference of the spread time of change of input signal "H" to "L", passing through the inverter G200, the inverter circuits G201 and G202, so the pulsed "L" is reversed to the pulsed "H" by the NAND circuit G207 which functions as an inverter circuit, and the off-signal is generated. Also, as well as above, the NAND circuit G213 generates the pulsed "L" corresponding to the difference of the spread time of change of input signal "L" to "H", passing through the inverter G210, the inverter circuits G211 and G212, so the pulsed "L" is reversed to the pulsed "H" by the NAND circuit G217 which functions as an inverter circuit, and the on-signal is generated.

On the other hand, when the third and fourth outside input signals are inputted, (in short, the third and fourth outside input signals are the pulsed "H"), the electric potentials which are lower than the power source electric potential Vdd by reversed electric potentials of the third and forth outside input signals, are given to the NAND circuits G207, G217, so regardless of the condition of input signals, on-signals and off-signals can be outputted. Therefore, on-signals and off-signals can be generated simultaneously for the test of the dv/dt transient signal.

It is possible to take out pulses corresponding to the direction of level transition of input signals from each NAND circuits G207, G217 using the pulse generation circuit according to the preferred embodiment. Also, the third and fourth outside input signals are given, so it is possible to take out signals corresponding to the period of giving the third and fourth outside input signals from the NAND circuits G207, G217, and if the third and fourth outside input signals are given simultaneously, it is possible to take out output signals simultaneously from the NAND circuits G207, G217. Also, if the pulse generation circuit according to the preferred embodiment is applied to the drive circuit of the power device, it is possible to output the pulse signals simultaneously to the HNMOS transistors 2, 3, and give outputs of the inverter circuits 6, 7 simultaneously for test to the protection circuit.

Also, if the pulse generation circuit according to the preferred embodiment is used, it is possible to achieve the object of the present invention using NAND circuits, NOR circuits and inverter circuits, and it is suitable for integrated circuit.

More, in the structure of the pulse generation circuit according to the preferred embodiment, the inverter circuits G201 and G202 compose one unit, and it equals to the structure composing one delay device having a certain amount of delay, and the inverter circuits G211 and G212 compose one unit, and it equals to the structure composing one delay device having a certain amount of delay as well as above.

Fourth Preferred Embodiment

Figure 5:
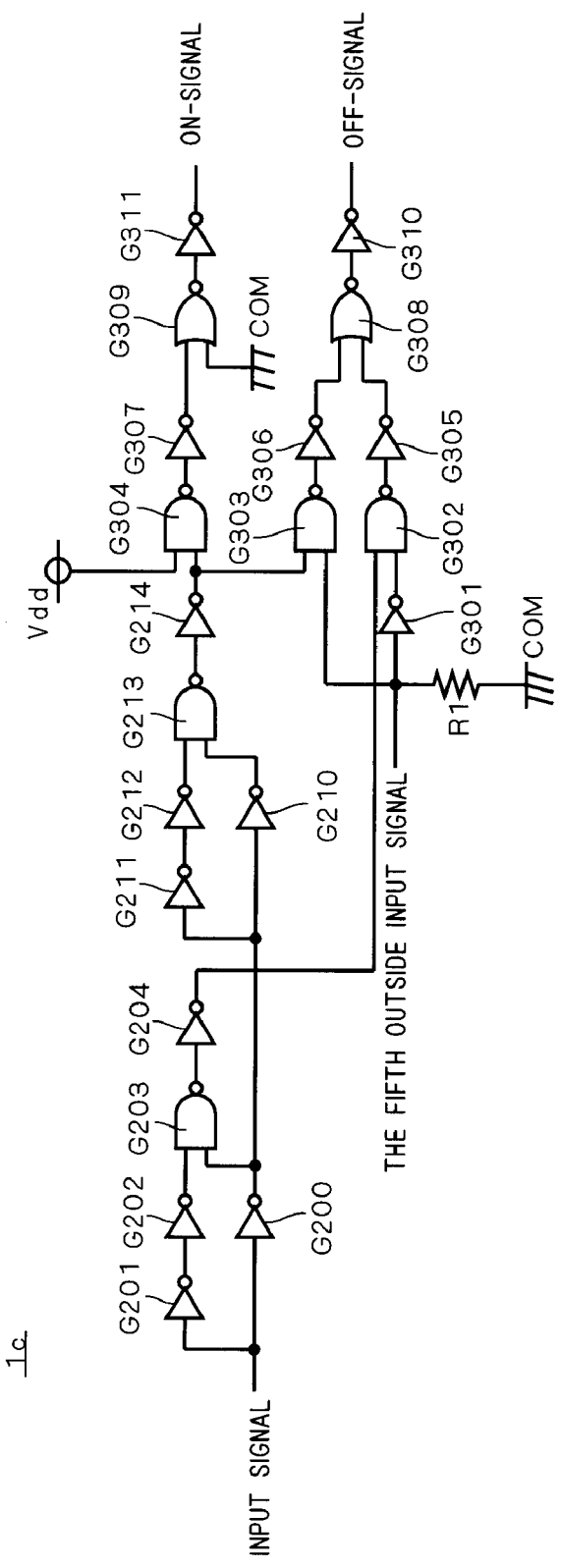
FIG. 5 shows a pulse generation circuit showing in the fourth preferred embodiment according to the present invention.

According to the preferred embodiment, it is possible to provide the pulse generation circuit, which can generate simultaneously on-signal and off-signal for test, too. FIG. 5 shows the pulse generation circuit 1c showing in the fourth preferred embodiment according to the present invention. The circuit composition around the pulse generation circuit 1c is same as the semiconductor device 100 having the drive circuit of the power device, shown in FIG. 7 and FIG. 8.

In FIG. 5, the input signal is inputted to the inverter circuit G200 in the pulse generation circuit 1c, at first. Also, the input signal is inputted to the inverter circuit G201, too, and the output of the inverter circuit G201 is inputted to the inverter circuit G202.

Outputs of the inverter circuit G200 and the inverter circuit G202 are inputted to the NAND circuit G203. And the output of the NAND circuit G203 is reversed by the inverter circuit G204.

Also, the output of the inverter circuit G200 is inputted to the inverter circuit G210 and the inverter circuit G211, too, and the output of the inverter circuit G211 is inputted to the inverter circuit G212.

And, outputs of the inverter circuit G210 and the inverter circuit G212 are inputted to the NAND circuit G213. And the output of the NAND circuit G213 is reversed by the inverter circuit G214.

The output of the inverter circuit G204 is given to one input terminal of the NAND circuit G302. The ground electric potential COM is given to other input terminal of the NAND circuit G302 through the resistance R1 and the inverter circuit G301. Also, the fifth outside input signal is given to one terminal of the resistance R1 on the inverter circuit G301 side, and it makes the electric potential of other input terminal of the NAND circuit G302 change.

More, the output of the NAND circuit G302 is reversed by the inverter circuit G305, and the output of the inverter circuit G305 is given to one input terminal of the NOR circuit G308.

Also, the output of the inverter circuit G214 is given to one input terminal of the NAND circuit G303. The ground electric potential COM is given to other input terminal of the NAND circuit G303 by the resistance R1. Also, the fifth outside input signal is given to other input terminal of the NAND circuit G303, it makes the electric potential of other input terminal of the NAND circuit G303 change.

The output of the NAND circuit G303 is reversed by the inverter circuit G306, the output of the inverter circuit G306 is inputted to other input terminal of the NOR circuit G308.

And, the output of the NOR circuit G308 is reversed by the inverter circuit G310, and the output of the inverter circuit G310 functions as an off-signal.

Also, the output of the inverter circuit G214 is given to one input terminal of the NAND circuit G304, too. The power source electric potential Vdd is given to other input terminal of the NAND circuit G304. The output of the NAND circuit G304 is reversed by the inverter circuit G307, and the output of the inverter circuit G307 is given to one input terminal of the NOR circuit G309. The ground electric potential COM is given to other input terminal of the NOR circuit G309.

And the output of the NOR circuit G309 is reversed by the inverter circuit G311, and the output of the inverter circuit G311 functions as an on-signal.

A following description explains about the operation of the pulse generation circuit 1c. At first, when the fifth outside input signal is not inputted, (in short, when the fifth outside input signals are "L"), the ground electric potential COM (its electric potential corresponds to the electric potential of "L") is given to the NAND circuit G303 through the resistance R1, so the NAND circuit G303 never outputs "L", therefore, the inverter circuit G306 never outputs "H", in this case, the NAND circuit G303 and the inverter circuit G306 do not influence on the change of logic value. Moreover, in the case, the ground electric potential COM is reversed by the inverter circuit G301, and given to the NAND circuit G302 through the resistance R1 (its electric potential corresponds to the electric potential of "H"), so the NAND circuit G302 functions as an ordinary inverter circuit.

Also, the power source electric potential Vdd (its electric potential corresponds to the electric potential of "H") is given to one input terminal of the NAND circuit G304, so the NAND circuit G304 functions as an ordinary inverter circuit. The ground electric potential COM (its electric potential corresponds to the electric potential of "L") is given to one input terminal of the NOR circuit G309, so the NOR circuit G309 functions as an ordinary inverter circuit as well as above.

And, the NAND circuit G302 and the inverter circuit G305, the NAND circuit G303 and the inverter circuit G306, the NAND circuit G304 and the inverter circuit G307, the NOR circuit G308 and the inverter circuit G310, the NOR circuit G309 and the inverter circuit G311, each of them composes one unit and it can be found that each unit composes the delay device. Therefore, in the case, the pulse generation circuit 1c has the same structure as a prior pulse generation structure 1d shown in FIG. 10.

In above case, the operation of the pulse generation circuit 1c is same as the operation of the conventional pulse generation circuit 1d, the NAND circuit G203 generates the pulsed "L" corresponding to the difference of the spread time of change of input signal "H" to "L", passing through the inverter G200, the inverter circuits G201 and G202, so the pulsed "L" is reversed to the pulsed "H" by the inverter circuit G204, and the off-signal is generated. Also, as well as above, the NAND circuit G213 generates the pulsed "L" corresponding to the difference of the spread time of change of input signal "L" to "H", passing through the inverter G210, the inverter circuits G211 and G212, so the pulsed "L" is reversed to the pulsed "H" by the inverter circuit G214, and the on-signal is generated.

On the other hand, when the fifth outside input signals are inputted, (in short, the fifth outside input signals are "H" for longer time than the pulse), "H" is reversed to "L" by the inverter circuit G301 and "L" is given to one terminal of the NAND circuit G302, so the NAND circuit G302 never outputs "L". Therefore, the inverter circuit G305 never outputs "H", in the condition, the NAND circuit G302 and the inverter circuit G305 do not influence to the change of logic value.

And, the electric potential which is higher than the ground electric potential COM by the electric potential of the fifth outside input signal, is given to the NAND circuit G303, so as well as the NAND circuit G304, the NAND circuit 303 functions as an ordinary inverter circuit. Moreover, the output of the inverter circuit G305 which is inputted to one input terminal of the NOR circuit G308, is fixed at "L", so as well as the NOR circuit G309, the NOR circuit G308 functions as an ordinary inverter circuit.

Figure 6:
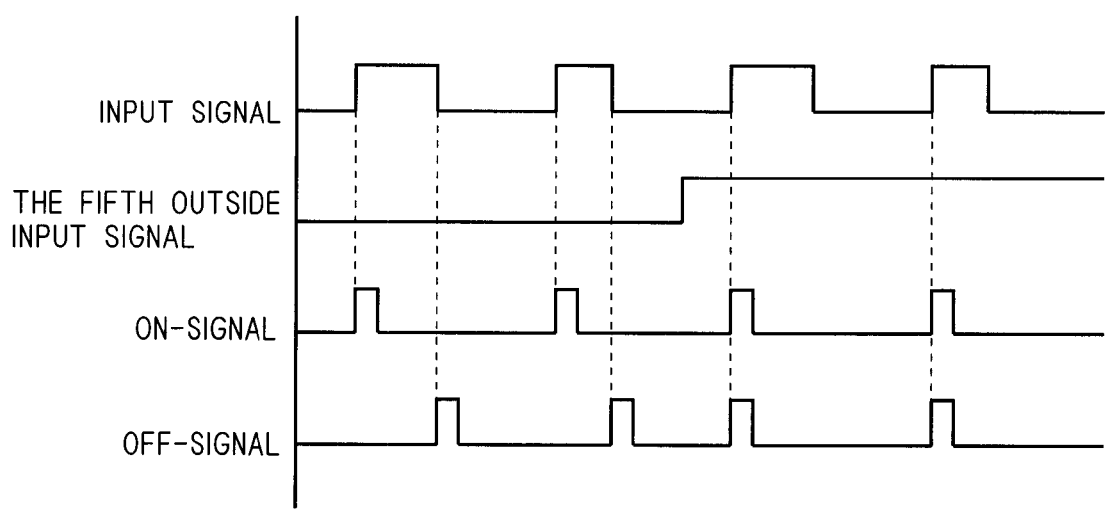
FIG. 6 is a timing chart of a pulse generation circuit showing in the fourth preferred embodiment according to the present invention.

In other words, as shown in FIG. 6, all the while the fifth outside input signal is inputted, on-signal which is outputted from the inverter circuit G214 which detects transient rising edge of the input signal, is outputted from both of the inverter circuits G310 and G311, so both of on-signal and off-signal are outputted. Therefore, it is possible to generate on-signal and off-signal simultaneously for test of the dv/dt transient signal.

It is possible to take out pulses corresponding to the direction of level transition of input signals from each inverter circuit G310, G311 using the pulse generation circuit according to the preferred embodiment. Also, the fifth outside input signals are given, so it is possible to take out pulses simultaneously corresponding to the level transition for one direction of the input signal from the inverter circuits G310, G311. Also, if the pulse generation circuit according to the preferred embodiment is applied to the drive circuit of the power device, it is possible to output the pulse signals simultaneously to the HNMOS transistor 2, 3, and give outputs of the inverter circuits 6, 7 simultaneously for test to the protection circuit.

Also, if the pulse generation circuit according to the preferred embodiment is used, it is possible to achieve the object of the present invention using NAND circuits, NOR circuits and inverter circuits, and it is suitable for integrated circuit. Also, in the NAND circuits G303, G304, the inverter circuits G306, G307, the NOR circuits G308, G309, and the inverter circuits G310, G311, logic elements in parallel at each stage from the inverter circuit G214, have same kind of circuits, so it is possible to match the amount of gate delay in each line in parallel, and take out pulses simultaneously from the inverter circuits G310, G311.

More, in the structure of the pulse generation circuit according to the preferred embodiment, the inverter circuits G201 and G202 compose one unit, and it equals to the structure composing one delay device having a certain amount of delay, and the inverter circuits G211 and G212 compose one unit, and it equals to the structure composing one delay device having a certain amount of delay as well as above. Moreover, the NAND circuit G203 and the inverter circuit G204 compose one unit, and it equals to the structure composing one AND device, and the NAND circuit G213 and the inverter G214 compose one unit, and it equals to the structure composing one AND device.

Moreover, the NAND circuit G302 and the inverter circuit G305, the NAND circuit G303 and the inverter circuit G306 compose each one unit, and each of them equals to the structure composing one AND device, the NAND circuit G304 and the inverter circuit G307, the NOR circuit G309 and the inverter circuit G311 compose each one unit, and each of them equals to the structure composing one delay device, and the NOR circuit G308 and the inverter circuit G310 compose one unit, and it equals to the structure composing one OR device.

According to a first aspect of the present invention, when first and second input signals transit simultaneously, the protection circuit prevents transition of first and second output signals by negating each of the plurality of inside signals in a part of the plurality of logic elements because of difference of amount of delay of each of the plurality of inside signals, so the protection circuit functions as a protection circuit for input signals to a set-reset-flip-flop circuit.

According to a second aspect of the present invention, in being inputted first and second input signal pulses at different time, the protection circuit can reverse each pulses and outputs pulses from first or second NOR element. Also, in being inputted first and second input signal pulses simultaneously, the output of OR element is asserted faster than outputs of first and second inverter elements, and is negated later than outputs of first and second inverter elements, so pulses are not outputted from first and second NOR elements. Therefore, it functions as a protection circuit for input signals to a set-reset-flip-flop circuit.

According to a third aspect of the present invention, it is possible to achieve a protection circuit according to claim 2 by using NAND circuits, NOR circuits and inverter circuits, and it is suitable for integrated circuit. Also, the structure has same kind of logic elements in parallel at each stage from input stage, so it is possible to match the amount of gate delay in each lines in parallel, and when first and second input pulses are inputted simultaneously, it is possible to prevent outputting pulses from first NOR element and second NOR element surely.

According to a fourth aspect of the present invention, it is possible to take out pulses corresponding to level-transient direction of first input signal. Moreover, it is possible to take out pulses simultaneously by giving second and third input signals.

According to a fifth aspect of the present invention, it is possible to take out pulses from first and second OR elements respectively corresponding to level-transient direction of first input signal. Also, it is possible to take out signals from first and second OR elements respectively corresponding to period of giving second and third input signals by giving second and third input signals, and if second and third input signals are given simultaneously, it is possible to take out output signals from first and second OR elements simultaneously.

According to a sixth aspect of the present invention, it is possible to achieve a pulse generation circuit according to claim 5 by using NAND circuits, NOR circuits and inverter circuits and it is suitable for integrated circuit.

According to a seventh aspect of the present invention, it is possible to take out pulses from second and fourth NAND elements respectively corresponding to level-transient direction of first input signal. Also, it is possible to take out signals from second and fourth NAND elements respectively corresponding to the period of giving second and third input signals, by giving second and third input signals, moreover if second and third input signals are given simultaneously, it is possible to take out output signals from second and fourth NAND elements.

According to an eighth aspect of the present invention, it is possible to achieve a pulse generation circuit according to claim 7 by using NAND circuits, NOR circuits and inverter circuits, so it is suitable for integrated circuit.

According to a ninth aspect of the present invention, it is possible to take out pulses from fourth delay element and OR element respectively, corresponding to level-transient direction of first input signal. Also, it is possible to take out pulses simultaneously from fourth delay element and OR element, corresponding to level-transient for a certain direction of first input signal.

According to a tenth aspect of the present invention, it is possible to achieve a pulse generation circuit according to claim 9 by using NAND circuits, NOR circuits and inverter circuits, so it is suitable for integrated circuit. Also, in third AND element, third and fourth delay elements and OR element, these structures have same kind of logic elements in parallel at each stage from second AND element, so it is possible to match the amount of gate delay in each lines in parallel, it is possible to take out pulses from fourth delay element and OR element simultaneously.

According to a eleventh aspect of the present invention, a drive circuit comprises protection means according to claim 1, so even if first and second level-shifted signals are given simultaneously by dv/dt transient signal which occurs in operating first and second switching devices, in short, in abnormal case, when on-signals and off-signals are given simultaneously, first and second output signals are not outputted from a protection circuit. So the drive circuit is possible to prevent mis-operations of set-reset-flip-flop circuit.

According to a twelfth aspect of the present invention, a drive circuit according to claim 11 comprises a protection circuit according to claim 2, so in being inputted first and second input signal pulses at different time, the protection circuit can reverse each pulses and outputs pulses from first or second NOR element. Also, in being inputted first and second input signal pulses simultaneously, the output of OR element is asserted faster than outputs of first and second inverter elements, and is negated later than outputs of first and second inverter elements, so pulses are not outputted from first and second NOR elements. Therefore, it functions as a protection circuit for input signals to a set-reset-flip-flop circuit.

According to a thirteenth aspect of the present invention, a drive circuit according to claim 12 comprises a protection circuit according to claim 3, so it is possible to achieve a protection circuit according to claim 12 by using NAND circuits, NOR circuits and inverter circuits, and it is suitable integrated circuit. Also, the structure has same kind of logic elements in parallel at each stage from input stage, so it is possible to match the amount of gate delay in each lines in parallel, and when first and second input pulses are inputted simultaneously, it is possible to prevent outputting pulses from first NOR element and second NOR element surely.

According to a fourteenth aspect of the present invention a drive circuit comprises a pulse generation circuit according to claim 4, so it is possible to output first and second pulse signals simultaneously, and to give first and second level-shifted signals to protection means simultaneously as test signals.

According to fifteenth aspect of the present invention, it is possible to take out pulses from first and second OR elements respectively corresponding to level-transient direction of first input signal. Also, it is possible to take out signals from first and second OR elements respectively corresponding to period of giving second and third input signals by giving second and third input signals, and if second and third input signals are given simultaneously, it is possible to take out output signals from first and second OR elements simultaneously.

According to a sixteenth aspect of the present invention, it is possible to achieve a drive circuit according to claim 15 by using NAND circuits, NOR circuits and inverter circuits and it is suitable for integrated circuit.

According to a seventeenth aspect of the present invention, it is possible to take out pulses from second and fourth NAND elements respectively corresponding to level-transient direction of first input signal. Also, it is possible to take out signals from second and fourth NAND elements respectively corresponding to the period of giving second and third input signals, by giving second and third input signals, moreover if second and third input signals are given simultaneously, it is possible to take out output signals from second and fourth NAND elements.

According to an eighteenth aspect of the present invention, it is possible to achieve a drive circuit according to claim 17 by using NAND circuits, NOR circuits and inverter circuits, so it is suitable for integrated circuit.

According to nineteenth aspect of the present invention, it is possible to take out pulses from fourth delay element and OR element respectively, corresponding to level-transient direction of first input signal. Also, it is possible to take out pulses simultaneously from fourth delay element and OR element, corresponding to level-transient for a certain direction of first input signal.

According to a twentieth aspect of the present invention, it is possible to achieve a drive circuit according to claim 19 by using NAND circuits, NOR circuits and inverter circuits, so it is suitable integrated circuit. Also, in third AND element, third and fourth delay elements and OR element, these structures have same kind of logic elements in parallel at each stage from second AND element, so it is possible to match the amount of gate delay in each lines in parallel, it is possible to take out pulses from fourth delay element and OR element simultaneously.

While the invention has been described in detail, the forepassing description is in all aspects illustrative and not restrictive. It is understood that numerous other modifications and variations can be devised without departing from the scope of the invention.

What is claimed is:

1. A pulse generation circuit configured to provide a first pulse and a second pulse to a switching device drive circuit in response to input signals, characterized in that:

a first input signal which level-shifts between a first logic value and a second logic value having an exclusive relation with said first logic value, is inputted to said pulse generation circuit, and a second input signal, or, in addition to said second input signal, a third input signal is inputted to said pulse generation circuit, and said pulse generation circuit outputs a first pulse on level-transiting of said first input signal from said first logic value to said second logic value when said second input signal, or, in addition to said second input signal, said third input signal is not inputted, and said pulse generation circuit outputs a second pulse on level-transiting of said first input signal from said second logic value to said first logic value when said second input signal, or, in addition to said second input signal, said third input signal is not inputted, and said pulse generating circuit simultaneously output said first and second pulses when said second input signal, or, in addition to said second input signal, said third input signal is inputted.

2. The pulse generation circuit according to claim 1 comprising:

a first inverter element which said first input signal is inputted to, and logic-reverses said first input signal and outputs said first input signal, a first delay element which said first input signal is inputted to, and outputs said first input signal with delaying from the output of said first inverter element, a first logical AND element which the outputs of said first inverter element and said first delay element are inputted to, and outputs an AND of said outputs of said first inverter element and said first delay element, a first logical OR element which the output of said first logical AND element and said first logic value are inputted to, and when said second input signal is given instead of said first logic value, said second logic value is inputted to, and outputs an OR of the output of said first logical AND element and said first logic value or said second logic value, as said second pulse, a second inverter element which the output of said first inverter element is inputted to, and logic-reverses the output of said first inverter element and outputs said output of said first inverter element, a second delay element which the output of said first inverter element is inputted to, and outputs said output of said first inverter element with delaying from the output of said second inverter element, a second logical AND element which the outputs of said second inverter element and said second delay element are inputted to, and outputs an AND of outputs of said second inverter element and said second delay element, a second logical OR element which the output of said second logical AND element and said first logic value are inputted to, and when said third input signal is given instead of said first logic value, said second logic value is inputted to, and outputs an OR of the output of said second logical AND element and said first logic value or said second logic value as said first pulse.

3. The pulse generation circuit according to claim 2, wherein said first inverter element comprising a first inverter circuit which logic-reverses said first input signal and outputs said first input signal, said first delay element comprising a second inverter circuit which logic-reverses said first input signal and outputs said first input signal, and a third inverter circuit which logic-reverses the output of said second inverter circuit and outputs the output of said second inverter circuit, said first logical AND element comprising a first NAND circuit which the outputs of said first inverter element and said first delay element are inputted to, and a fourth inverter circuit which the output of said first NAND circuit is inputted to, said first logical OR element comprising a first NOR circuit which logic-reverses an OR of the output of said first logical AND element and said first or second logic value and outputs said OR, and a fifth inverter circuit which the output of said first NOR circuit is inputted to, said second inverter element comprising a sixth inverter circuit which logic-reverses the output of said first inverter element and outputs said output of said first inverter element, said second delay element comprising a seventh inverter circuit which logic-reverses the output of said first inverter element and outputs said output of said first inverter element, and an eighth inverter circuit which logic-reverses the output of said seventh inverter circuit and outputs said output of said seventh inverter circuit, said second logical AND element comprising a second NAND circuit which the outputs of said second inverter element and said second delay element are inputted to, and a ninth inverter circuit which the output of said second NAND circuit is inputted to, and said second logical OR element comprising a second NOR circuit which logic-reverses an OR of the output of said second logical AND element and said first or second logic value and outputs said OR, and a tenth inverter circuit which the output of said second NOR circuit is inputted to.

4. The pulse generation circuit according to claim 1 comprising:

a first inverter element which said first input signal is inputted to, and logic-reverses said first input signal and outputs said first input signal, a first delay element which said first input signal is inputted to, and outputs said first input signal with delaying from the output of said first inverter element, a first logical NAND element which the outputs of said first inverter element and said first delay element are inputted to, and logic-reverses an AND of the outputs of said first inverter element and said first delay element and outputs said AND of said outputs of said first inverter element and said first delay element, a second logical NAND element which the output of said first logical NAND element and said second logic value are inputted to, and when said second input signal is given instead of said second logic value, said first logic value is inputted to, and logic-reverses an AND of the output of said first logical NAND element and said first or second logic value and outputs said AND as said second pulse, a second inverter element which the output of said first inverter element is inputted to, and logic-reverses the output of said first inverter element and outputs said output of said first inverter element, a second delay element which the output of said first inverter element is inputted to, and outputs the output of said first inverter element with delaying from the output of said second inverter element, a third logical NAND element which the outputs of said second inverter element and said second delay element are inputted to, and logic-reverses an AND of the outputs of said second inverter element and said second delay element and outputs said AND, a fourth logical NAND element which the outputs of said third logical NAND element and said second logic value are inputted to, and when said third input signal is given instead of said second logic value, said first logic value is inputted to, and logic-reverses an AND of the output of said third logical NAND element and said first or second logic value and outputs said AND as said first pulse.

5. The pulse generation circuit according to claim 4, wherein said first inverter element comprising a first inverter circuit which logic-reverses said first input signal and outputs said first input signal, said first delay element comprising a second inverter circuit which logic-reverses said first input signal and outputs said first input signal, and a third inverter circuit which logic-reverses the output of said second inverter circuit and outputs said output of said second inverter circuit, said first logical NAND element comprising a first NAND circuit which the outputs of said first inverter element and said first delay element are inputted to, said second logical NAND element comprising a second NAND circuit which the outputs of said first logical NAND element and said first or second logic value are inputted to, said second inverter element comprising a fourth inverter circuit which logic-reverses the output of said first inverter element and outputs said output of said first inverter element, said second delay element comprising a fifth inverter circuit which logic-reverses the output of said first inverter element and outputs the output of said first inverter element, and a sixth inverter circuit which logic-reverses the output of said fifth inverter circuit and outputs the output of said fifth inverter circuit, said third logical NAND element comprising a third NAND circuit which the outputs of said second inverter element and said second delay element are inputted to, and said fourth logical NAND element comprising a fourth NAND circuit which the outputs of said third logical NAND element and said first or second logic value are inputted to.

6. The pulse generation circuit according to claim 1 comprising:

a first inverter element which said first input signal is inputted to, and logic-reverses said first input signal and outputs said first input signal, a first delay element which said first input signal is inputted to, and outputs said first input signal with delaying from the output of said first inverter element, a first logical AND element which the outputs of said first inverter element and said first delay element are inputted to, and outputs an AND of outputs of said first inverter element and said first delay element, a second inverter element which the output of said first inverter element is inputted to, and logic-reverses the output of said first inverter element and outputs said output of said first inverter element, a second delay element which the output of said first inverter element is inputted to, and outputs said output of said first inverter element with delaying from the output of said second inverter element, a second logical AND element which the outputs of said second inverter element and said second delay element are inputted to, and outputs an AND of outputs of said second inverter element and said second delay element, a third logical AND element which the outputs of said second logical AND element and said first logic value are inputted to, and when said second input signal is given instead of said first logic value, said second logic value is inputted to, and outputs an AND of the output of said second logical AND element and said first or second logic value with delaying for the amount of first delay, a fourth logical AND element which logic-reversed said first logic value and the output of said first logical AND element are inputted to, and when said second input signal is given instead of logic-reversed said first logic value, logic-reversed said second logic value is inputted to, and outputs an AND of the output of said first logical AND element and logic-reversed said first or second logic value with delaying for the amount of said first delay, a logical OR element which the outputs of said third and fourth logical AND elements are inputted to, and outputs an OR of said third and fourth logical AND elements with delaying for the amount of second delay, as said second pulse, and when said second input signal is given, outputs said first and said second pulses simultaneously, a third delay element which the output of said second logical AND element is inputted to, and outputs the output of said second logical AND element with delaying for the amount of said first delay, and a fourth delay element which the output of said third delay element is inputted to, and outputs said output of said third delay element with delaying for the amount of said second delay, as said first pulse.

7. The pulse generation circuit according to claim 6, wherein said first inverter element comprising a first inverter circuit which logic-reverses said first input signal and outputs said first input signal, said first delay element comprising a second inverter circuit which logic-reverses said first input signal and outputs said first input signal, and a third inverter circuit which logic-reverses the output of said second inverter circuit and outputs the output of said second inverter circuit, said first logical AND element comprising a first NAND circuit which the outputs of said first inverter element and said first delay element are inputted to, and a fourth inverter circuit which the output of said first NAND circuit is inputted to, said second inverter element comprising a fifth inverter circuit which logic-reverses the output of said first inverter element and outputs the output of said first inverter element, said second delay element comprising a sixth inverter circuit which logic-reverses the output of said first inverter element and outputs the output of said first inverter element, and a seventh inverter circuit which logic-reverses the output of said sixth inverter circuit and outputs the output of said sixth inverter circuit, said second logical AND element comprising a second NAND circuit which the outputs of said second inverter element and said second delay element are inputted to, and an eighth inverter circuit which the output of said second NAND circuit is inputted to, said third logical AND element comprising a third NAND circuit which logic-reverses an AND of the output of said second logical AND element and said first or second logic value and outputs said AND, and a ninth inverter circuit which the output of said third NAND circuit is inputted to, said fourth logical AND element comprising a fourth NAND circuit which logic-reverses an AND of the output of said first logical AND element and logic-reversed said first or second logic value and outputs said AND, and a tenth inverter circuit which the output of said fourth NAND circuit is inputted to, said logical OR element comprising a first NOR circuit which logic-reverses an OR of the outputs of said third and fourth logical AND element and outputs said OR, and an eleventh inverter circuit which the output of said first NOR circuit is inputted to, said third delay element comprising a fifth NAND circuit which logic-reverses an AND of the output of said second logical AND element and said second logic value and outputs said AND, and a twelfth inverter circuit which the output of said fifth NAND circuit is inputted to, and said fourth delay element comprising a second NOR circuit which logic-reverses an OR of the output of said third delay element and said first logic value and outputs said OR, and a thirteenth inverter circuit which the output of said second NOR circuit is inputted to.

8. The pulse generation circuit according to claim 1, wherein said switching device drive circuit comprises:

a protection device configured to prevent a mis-operation in the switching device drive circuit, said pulse generating circuit being configured to simultaneously provide the first pulse and the second pulse to the protection device.

9. A drive circuit for driving a switching device comprising:

control means which control conductive condition of said switching device, pulse generation means which generates first and second pulse signals respectively corresponding to level transient of rising-up and falling-down of input signal, level shifting means which level-shifts said first and second pulse signals to generate first and second level-shifted signals respectively corresponding to said first and second pulse signals, wherein said first pulse signal is on-signal which turns on said switching device, said second pulse signal is off-signal which turns off said switching device, said pulse generation means which is a pulse generation circuit according to claim 4, wherein said first input signal corresponds to said input signal and said first pulse corresponds to said first pulse signal, and said second pulse corresponds to said second pulse signal, said control means comprises control signal outputting means for outputting a control signal which keeps said switching device turning-on or turning-off depending on said first and second level-shifted signals, and protection means provided at pre-stage of said control signal outputting means for giving a predetermined signal to said control signal outputting means to keep said control signal outputting means outputting said control signal just before when said first and second level-shifted signals are given simultaneously.

10. The drive circuit according to claim 9:

wherein a pulse generation circuit comprising a first inverter element which said first input signal is inputted to, and logic-reverses said first input signal and outputs said first input signal, a first delay element which said first input signal is inputted to, and outputs said first input signal with delaying from the output of said first inverter element, a first logical AND element which the outputs of said first inverter element and said first delay element are inputted to, and outputs an AND of said outputs of said first inverter element and said first delay element, a first logical OR element which the output of said first logical AND element and said first logic value are inputted to, and when said second input signal is given instead of said first logic value, said second logic value is inputted to, and outputs an OR of the output of said first logical AND element and said first logic value or said second logic value, as said second pulse, a second inverter element which the output of said first inverter element is inputted to, and logic-reverses the output of said first inverter element and outputs said output of said first inverter element, a second delay element which the output of said first inverter element is inputted to, and outputs said output of said first inverter element with delaying from the output of said second inverter element, a second logical AND element which the outputs of said second inverter element and said second delay element are inputted to, and outputs an AND of outputs of said second inverter element and said second delay element, a second logical OR element which the output of said second logical AND element and said first logic value are inputted to, and when said third input signal is given instead of said first logic value, said second logic value is inputted to, and outputs an OR of the output of said second logical AND element and said first logic value or said second logic value as said first pulse.

11. The drive circuit according to claim 10, wherein said first inverter element comprising a first inverter circuit which logic-reverses said first input signal and outputs said first input signal, said first delay element comprising a second inverter circuit which logic-reverses said first input signal and outputs said first input signal, and a third inverter circuit which logic-reverses the output of said second inverter circuit and outputs the output of said second inverter circuit, said first logical AND element comprising a first NAND circuit which the outputs of said first inverter element and said first delay element are inputted to, and a fourth inverter circuit which the output of said first NAND circuit is inputted to, said first logical OR element comprising a first NOR circuit which logic-reverses an OR of the output of said first logical AND element and said first or second logic value and outputs said OR, and a fifth inverter circuit which the output of said first NOR circuit is inputted to, said second inverter element comprising a sixth inverter circuit which logic-reverses the output of said first inverter element and outputs said output of said first inverter element, said second delay element comprising a seventh inverter circuit which logic-reverses the output of said first inverter element and outputs said output of said first inverter element, and an eighth inverter circuit which logic-reverses the output of said seventh inverter circuit and outputs said output of said seventh inverter circuit, said second logical AND element comprising a second NAND circuit which the outputs of said second inverter element and said second delay element are inputted to, and a ninth inverter circuit which the output of said second NAND circuit is inputted to, said second logical OR element comprising a second NOR circuit which logic-reverses an OR of the output of said second AND element and said first or second logic value and outputs said OR, and a tenth inverter circuit which the output of said second NOR circuit is inputted to.

12. The drive circuit according to claim 9:

wherein said pulse generation circuit comprising:

a first inverter element which said first input signal is inputted to, and logic-reverses said first input signal and outputs said first input signal, a first delay element which said first input signal is inputted to, and outputs said first input signal with delaying from the output of said first inverter element, a first logical NAND element which the outputs of said first inverter element and said first delay element are inputted to, and logic-reverses an AND of the outputs of said first inverter element and said first delay element and outputs said AND of said outputs of said first inverter element and said first delay element, a second logical NAND element which the output of said first logical NAND element and said second logic value are inputted to, and when said second input signal is given instead of said second logic value, said first logic value is inputted to, and logic-reverses an AND of the output of said logical first NAND element and of said first or second logic value and outputs said AND as said second pulse, a second inverter element which the output of said first inverter element is inputted to, and logic-reverses the output of said first inverter element and outputs said output of said first inverter element, a second delay element which the output of said first inverter element is inputted to, and outputs the output of said first inverter element with delaying from the output of said second inverter element, a third logical NAND element which the outputs of said second inverter element and said second delay element are inputted to, and logic-reverses an AND of the outputs of said second inverter element and said second delay element and outputs said AND, a fourth logical NAND element which the outputs of said third logical NAND element and said second logic value are inputted to, and when said third input signal is given instead of said second logic value, said first logic value is inputted to, and logic-reverses an AND of the output of said third logical NAND element and said first or second logic value and outputs said AND as said first pulse.

13. The drive circuit according to claim 12, wherein said first inverter element comprising a first inverter circuit which logic-reverses said first input signal and outputs said first input signal, said first delay element comprising a second inverter circuit which logic-reverses said first input signal and outputs said first input signal, and a third inverter circuit which logic-reverses the output of said second inverter circuit and outputs said output of said second inverter circuit, said first logical NAND element comprising a first NAND circuit which the outputs of said first inverter element and said first delay element are inputted to, said second logical NAND element comprising a second NAND circuit which the outputs of said first logical NAND element and said first or second logic value are inputted to, said second inverter element comprising a fourth inverter circuit which logic-reverses the output of said first inverter element and outputs said output of said first inverter element, said second delay element comprising a fifth inverter circuit which logic-reverses the output of said first inverter element and outputs the output of said first inverter element, and a sixth inverter circuit which logic-reverses the output of said fifth inverter circuit and outputs the output of said fifth inverter circuit, said third logical NAND element comprising a third NAND circuit which the outputs of said second inverter element and said second delay element are inputted to, and said fourth logical NAND element comprising a fourth NAND circuit which the outputs of said third logical NAND element and said first or second logic value are inputted to.

14. The drive circuit according to claim 9:

wherein said pulse generation circuit comprising:

a first inverter element which said first input signal is inputted to, and logic-reverses said first input signal and outputs said first input signal, a first delay element which said first input signal is inputted to, and outputs said first input signal with delaying from the output of said first inverter element, a first logical AND element which the outputs of said first inverter element and said first delay element are inputted to, and outputs an AND of outputs of said first inverter element and said first delay element, a second inverter element which the output of said first inverter element is inputted to, and logic-reverses the output of said first inverter element and outputs said output of said first inverter element, a second delay element which the output of said first inverter element is inputted to, and outputs said output of said first inverter element with delaying from the output of said second inverter element, a second logical AND element which the outputs of said second inverter element and said second delay element are inputted to, and outputs an AND of outputs of said second inverter element and said second delay element, a third logical AND element which the outputs of said second AND element and said first logic value are inputted to, and when said second input signal is given instead of said first logic value, said second logic value is inputted to, and outputs an AND of the output of said second logical AND element and said first or second logic value with delaying for the amount of first delay, a fourth logical AND element which logic-reversed said first logic value and the output of said first logical AND element are inputted to, and when said second input signal is given instead of logic-reversed said first logic value, logic-reversed said second logic value is inputted to, and outputs an AND of the output of said first logical AND element and logic-reversed said first or second logic value with delaying for the amount of said first delay, a logical OR element which the outputs of said third and fourth logical AND elements are inputted to, and outputs an OR of said third and fourth logical AND elements with delaying for the amount of second delay, as said second pulse, and when said second input signal is given, outputs said first and said second pulses simultaneously, a third delay element which the output of said second logical AND element is inputted to, and outputs the output of said second logical AND element with delaying for the amount of said first delay, and a fourth delay element which the output of said third delay element is inputted to, and outputs said output of said third delay element with delaying for the amount of said second delay, as said first pulse.

15. The drive circuit according to claim 14, wherein said first inverter element comprising a first inverter circuit which logic-reverses said first input signal and outputs said first input signal, said first delay element comprising a second inverter circuit which logic-reverses said first input signal and outputs said first input signal, and a third inverter circuit which logic-reverses the output of said second inverter circuit and outputs the output of said second inverter circuit, said first logical AND element comprising a first NAND circuit which the outputs of said first inverter element and said first delay element are inputted to, and a fourth inverter circuit which the output of said first NAND circuit is inputted to, said second inverter element comprising a fifth inverter circuit which logic-reverses the output of said first inverter element and outputs the output of said first inverter element, said second delay element comprising a sixth inverter circuit which logic-reverses the output of said first inverter element and outputs the output of said first inverter element, and a seventh inverter circuit which logic-reverses the output of said sixth inverter circuit and outputs the output of said sixth inverter circuit, said second logical AND element comprising a second NAND circuit which the outputs of said second inverter element and said second delay element are inputted to, and an eighth inverter circuit which the output of said second NAND circuit is inputted to, said third logical AND element comprising a third NAND circuit which logic-reverses an AND of the output of said second logical AND element and said first or second logic value-and outputs said AND, and a ninth inverter circuit which the output of said third NAND circuit is inputted to, said fourth logical AND element comprising a fourth NAND circuit which logic-reverses an AND of the output of said first logical AND element and logic-reversed said first or second logic value and outputs said AND, and a tenth inverter circuit which the output of said fourth NAND circuit is inputted to, said logical OR element comprising a first NOR circuit which logic-reverses an OR of the outputs of said third and fourth logical AND element and outputs said OR, and an eleventh inverter circuit which the output of said first NOR circuit is inputted to, said third delay element comprising a fifth NAND circuit which logic-reverses an AND of the output of said second logical AND element and said second logic value and outputs said AND, and a twelfth inverter circuit which the output of said fifth NAND circuit is inputted to, and said fourth delay element comprising a second NOR circuit which logic-reverses an OR of the output of said third delay element and said first logic value and outputs said OR, and a thirteenth inverter circuit which the output of said second NOR circuit is inputted to.

16. A pulse generation circuit configured to provide first and second output pulses to a switching device drive circuit, comprising:

means for receiving a first input signal that varies between first and second logic levels;

means for receiving a second input signal, or, in addition to said second input signal, a third input signal;

means for outputting a first pulse in response to a transition of the first signal from the first logic level to the second logic level when said second input signal, or, in addition to said second input signal, said third input signal is not applied;

means for outputting a second pulse in response to a transition of the first input signal from the second logic level to the first logic level when said second input signal, or in addition to said second input signal, said third input signal is not applied; and means for simultaneously outputting said first and second pulses when said second input signal, or, in addition to said second input signal, said third input signal is applied.

* * * * *